United States Patent
Kano et al.

(10) Patent No.: US 9,574,266 B2
(45) Date of Patent: Feb. 21, 2017

(54) LAMINATE BODY, GAS BARRIER FILM, AND METHOD OF MANUFACTURING THE SAME

(71) Applicant: TOPPAN PRINTING CO., LTD., Tokyo (JP)

(72) Inventors: Mitsuru Kano, Tokyo (JP); Jin Sato, Tokyo (JP); Toshiaki Yoshihara, Tokyo (JP); Masato Kon, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 219 days.

(21) Appl. No.: 14/164,867

(22) Filed: Jan. 27, 2014

(65) Prior Publication Data
US 2014/0141255 A1 May 22, 2014

Related U.S. Application Data

(63) Continuation of application No. PCT/JP2012/069158, filed on Jul. 27, 2012.

(30) Foreign Application Priority Data

Jul. 28, 2011 (JP) .................................. 2011-165901
Jul. 28, 2011 (JP) .................................. 2011-165902

(51) Int. Cl.
*C23C 16/02* (2006.01)
*C23C 16/04* (2006.01)
(Continued)

(52) U.S. Cl.
CPC ......... *C23C 16/403* (2013.01); *C23C 16/0245* (2013.01); *C23C 16/0272* (2013.01);
(Continued)

(58) Field of Classification Search
None
See application file for complete search history.

(56) References Cited

U.S. PATENT DOCUMENTS 4,210,699 A * 7/1980 Schroeter ......... B29D 11/00865
351/159.57
5,137,791 A * 8/1992 Swisher ................... C08J 7/123
428/612
(Continued)

FOREIGN PATENT DOCUMENTS

JP 2004-017591 * 1/2004
JP 2007-90803 4/2007
(Continued)

OTHER PUBLICATIONS

Extended European Search Report dated Mar. 13, 2015 in corresponding European Patent Application No. 12817350.7.
(Continued)

*Primary Examiner* — Vivian Chen

(57) ABSTRACT

A laminate body includes a base material, a film-like or a membrane-like undercoat layer that is formed in at least a portion of the outer surface of the base material, and an atomic layer deposition film that is formed on a surface opposite to a surface coming into contact with the base material among both surfaces of the undercoat layer in the thickness direction thereof. At least a portion of precursors of the atomic layer deposition film bind to the undercoat layer, and the atomic layer deposition film is formed into a membrane shape covering the undercoat layer.

13 Claims, 11 Drawing Sheets

(51) Int. Cl.

| | |
|---|---|
| *C23C 16/44* | (2006.01) |
| *C23C 16/455* | (2006.01) |
| *C08K 3/00* | (2006.01) |
| *C09J 201/02* | (2006.01) |
| *C09J 201/06* | (2006.01) |
| *C09J 201/08* | (2006.01) |
| *B05D 3/14* | (2006.01) |
| *B05D 3/10* | (2006.01) |
| *B32B 7/04* | (2006.01) |
| *C23C 16/40* | (2006.01) |
| *C23C 28/04* | (2006.01) |
| *C23C 28/00* | (2006.01) |
| *B05D 3/00* | (2006.01) |

(52) U.S. Cl.
CPC ...... *C23C 16/405* (2013.01); *C23C 16/45525* (2013.01); *C23C 16/45555* (2013.01); *C23C 28/00* (2013.01); *C23C 28/042* (2013.01); *B05D 3/007* (2013.01); *B05D 3/107* (2013.01); *B05D 3/141* (2013.01); *B05D 3/145* (2013.01); *B05D 3/148* (2013.01); *B32B 7/04* (2013.01); *C08K 3/0008* (2013.01); *C08K 3/0033* (2013.01); *C09J 201/02* (2013.01); *C09J 201/025* (2013.01); *C09J 201/06* (2013.01); *C09J 201/08* (2013.01); *C09J 2400/10* (2013.01); *C09J 2400/22* (2013.01); *C23C 16/02* (2013.01); *C23C 16/0227* (2013.01); *C23C 16/04* (2013.01); *C23C 16/44* (2013.01); *C23C 16/455* (2013.01); *Y10T 428/25* (2015.01); *Y10T 428/251* (2015.01); *Y10T 428/258* (2015.01); *Y10T 428/259* (2015.01); *Y10T 428/31562* (2015.04); *Y10T 428/31721* (2015.04); *Y10T 428/31757* (2015.04)

(56) References Cited

U.S. PATENT DOCUMENTS

| | | | | |
|---|---|---|---|---|
| 5,200,272 | A * | 4/1993 | Sirinyan | C23C 18/30 427/304 |
| 6,548,121 | B1 * | 4/2003 | Bauer | B05D 3/062 427/407.2 |
| 6,855,396 | B1 * | 2/2005 | Mennig | B05D 7/546 427/314 |
| 7,407,895 | B2 * | 8/2008 | Kunitake | C23C 18/1212 257/E21.271 |
| 2001/0049022 | A1 * | 12/2001 | Takeuchi | B32B 27/00 428/423.1 |
| 2005/0029513 | A1 * | 2/2005 | Kawashima | C23C 14/024 257/40 |
| 2005/0147919 | A1 * | 7/2005 | Kunz | B05D 3/067 430/311 |
| 2006/0159856 | A1 * | 7/2006 | Kunz | C09J 5/02 427/402 |
| 2006/0257575 | A1 * | 11/2006 | Macor | B05D 3/06 427/372.2 |
| 2006/0257681 | A1 * | 11/2006 | Wolf | B05D 3/06 428/626 |
| 2007/0128441 | A1 * | 6/2007 | Macor | B05D 3/067 428/411.1 |
| 2008/0193747 | A1 * | 8/2008 | MacDonald | B29C 55/04 428/336 |
| 2009/0092768 | A1 * | 4/2009 | Hayoz | C07C 225/22 427/519 |
| 2009/0220794 | A1 * | 9/2009 | O'Neill | C09J 5/02 428/414 |
| 2009/0291258 | A1 * | 11/2009 | Higashi | C08J 7/123 428/141 |
| 2010/0323208 | A1 * | 12/2010 | Song | B32B 7/12 428/447 |
| 2011/0100454 | A1 | 5/2011 | Adam et al. | |
| 2011/0110454 | A1 * | 5/2011 | Sampath | H04L 1/0028 375/295 |
| 2011/0209901 | A1 * | 9/2011 | MacDonald | C08J 7/04 174/254 |
| 2012/0177903 | A1 * | 7/2012 | Sneck | C23C 16/403 428/216 |
| 2014/0141218 | A1 * | 5/2014 | Yoshihara | C23C 16/403 428/213 |
| 2015/0292086 | A1 * | 10/2015 | Sato | C08J 7/045 428/473.5 |

FOREIGN PATENT DOCUMENTS

| | | | |
|---|---|---|---|
| JP | 2007-516347 | | 6/2007 |
| JP | 2009-52063 | | 3/2009 |
| JP | 2010-242150 | | 10/2010 |
| JP | 2011-518055 | | 6/2011 |
| JP | 2011-173261 | * | 9/2011 |
| JP | 2012-96431 | | 5/2012 |
| WO | 2004/105149 A1 | | 12/2004 |
| WO | WO 2006/014591 | * | 2/2006 |
| WO | WO 2009/016388 | * | 2/2009 |
| WO | 2009/127842 A1 | | 10/2009 |
| WO | WO 2011/030004 A1 | | 3/2011 |

OTHER PUBLICATIONS

International Search Report mailed Oct. 23, 2012 in corresponding International Patent Application No. PCT/JP2012/069158.
"Reaction machanisms during plasma-assisted atomic layer deposition of metal oxides: A case study for Al 2 O 3" S.B.S. Heil, et al. AIP Journal of Applied Physics 103, 103302 (2008).

* cited by examiner

FIG. 3

| | BASE MATERIAL | UNDERCOAT LAYER | PLASMA ETCHING | OXYGEN PLASMA TREATMENT FOLLOWING PLASMA ETCHING | ALD LAYER MATERIAL | FILM THICKNESS | WVTR [g/m2/day] | PEELING STRENGTH [N/10 mm] |
|---|---|---|---|---|---|---|---|---|
| EXAMPLE 1 | PET 100 μm | PVA/COLLOIDAL SILICA | NOT PERFORMED | NOT PERFORMED | $TiO_2$ | 10 nm | $< 5 \times 10^{-4}$ | 6.1 |
| EXAMPLE 2 | PET 100 μm | PVA/COLLOIDAL SILICA | PERFORMED | NOT PERFORMED | $TiO_2$ | 10 nm | $< 5 \times 10^{-4}$ | 6.4 |
| EXAMPLE 3 | PET 100 μm | PVA/COLLOIDAL SILICA | PERFORMED | PERFORMED | $TiO_2$ | 10 nm | $< 5 \times 10^{-4}$ | 6.5 |
| EXAMPLE 4 | PET 100 μm | POLYESTER URETHANE/ORGANOSILICA SOL | NOT PERFORMED | NOT PERFORMED | $TiO_2$ | 10 nm | $< 5 \times 10^{-4}$ | 7.0 |
| EXAMPLE 5 | PET 100 μm | POLYESTER URETHANE/ORGANOSILICA SOL | PERFORMED | NOT PERFORMED | $TiO_2$ | 10 nm | $< 5 \times 10^{-4}$ | 7.5 |
| EXAMPLE 6 | PET 100 μm | POLYESTER URETHANE/ORGANOSILICA SOL | PERFORMED | PERFORMED | $TiO_2$ | 10 nm | $< 5 \times 10^{-4}$ | 7.7 |
| EXAMPLE 7 | PET 100 μm | PVA/LAYERED COMPOUND | PERFORMED | NOT PERFORMED | $TiO_2$ | 10 nm | $< 5 \times 10^{-4}$ | 6.0 |
| EXAMPLE 8 | PET 100 μm | PVA/LAYERED COMPOUND | PERFORMED | PERFORMED | $TiO_2$ | 10 nm | $< 5 \times 10^{-4}$ | 6.1 |
| EXAMPLE 9 | PET 100 μm | PVA/LAYERED COMPOUND | PERFORMED | PERFORMED | $TiO_2$ | 5 nm | $< 5 \times 10^{-4}$ | 6.0 |
| EXAMPLE 10 | PET 100 μm | PVA/LAYERED COMPOUND | PERFORMED | PERFORMED | $TiO_2$ | 5 nm | $< 5 \times 10^{-4}$ | 6.1 |
| COMPARATIVE EXAMPLE 1 | PET 100 μm | ABSENT | NOT PERFORMED | PERFORMED | $TiO_2$ | 10 nm | $5.2 \times 10^{-3}$ | 5.0 |
| COMPARATIVE EXAMPLE 2 | PET 100 μm | ABSENT | NOT PERFORMED | PERFORMED | $TiO_2$ | 20 nm | $5.3 \times 10^{-3}$ | 5.1 |
| COMPARATIVE EXAMPLE 3 | PET 100 μm | PVA | NOT PERFORMED | PERFORMED | $TiO_2$ | 10 nm | $3.8 \times 10^{-3}$ | 5.8 |

METHYL GROUP

HYDROXYL GROUP

AMIDE GROUP

SULFONE GROUP

ESTER GROUP (NOT EASILY ADSORBED UNLESS
PLASMA TREATMENT IS PERFORMED)

FIG. 15

| | BASE MATERIAL | WHETHER OR NOT PLASMA TREATMENT IS PERFORMED | UNDERCOAT LAYER | ALD FILM | WVTR (g/m²/day) | PEELING STRENGTH [N/10mm] |
|---|---|---|---|---|---|---|
| EXAMPLE 1 | PET 100 μm | PERFORMED | PVA LAYER | $Al_2O_3$ | $5.3 \times 10^{-3}$ | 5.8 |
| EXAMPLE 2 | PET 100 μm | PERFORMED | POLYESTER URETHANE | $Al_2O_3$ | $8.7 \times 10^{-4}$ | 6.8 |
| EXAMPLE 3 | ARAMID 100 μm | PERFORMED | POLYIMIDE RESIN LAYER | $Al_2O_3$ | $1.0 \times 10^{-3}$ | 6.5 |
| EXAMPLE 4 | PET 100 μm | PERFORMED | ABSENT | $Al_2O_3$ | $2.1 \times 10^{-3}$ | 5.0 |
| COMPARATIVE EXAMPLE 1 | PET 100 μm | NOT PERFORMED | ABSENT | $Al_2O_3$ | $7.3 \times 10^{-3}$ | 4.0 |
| COMPARATIVE EXAMPLE 2 | PET 100 μm | PERFORMED | PP LAYER | $Al_2O_3$ | $3.6 \times 10^{-1}$ | 2.1 |

LAMINATE BODY, GAS BARRIER FILM, AND METHOD OF MANUFACTURING THE SAME

CROSS REFERENCE TO RELATED APPLICATIONS

This application is a continuation application based on a PCT patent application No. PCT/JP2012/069158, filed Jul. 27, 2012, whose priority is claimed on Japanese Patent Applications No. 2011-165901 filed Jul. 28, 2011 and Japanese Patent Application No. 2011-165902 filed Jul. 28, 2011, the entire contents of which are hereby incorporated by reference.

BACKGROUND OF THE INVENTION

Field of the Invention

The present invention relates to a laminate body in which an atomic layer deposition film is formed on the outer surface of a base material, a gas barrier film formed of the laminate body, and a method of manufacturing the same.

Description of the Related Art

Methods of forming a thin film on the surface of a substance using a gaseous phase that makes a substance move at an atomic/molecular level similar to gas are roughly classified into Chemical Vapor Deposition (CVD) and Physical Vapor Deposition (PVD).

Typical methods of PVD include vacuum deposition, sputtering, and the like. Particularly, with sputtering, a high-quality thin film having excellent uniformity of film quality and film thickness can be formed in general, even though the cost of the apparatus is high. Therefore, this method is being widely applied to display devices such as a liquid crystal display.

CVD is a method of injecting raw material gas into a vacuum chamber and decomposing or reacting one, two, or more kinds of gases on a substrate by means of heat energy to grow a thin solid film. At this time, in order to accelerate the reaction during the film formation or to decrease the reaction temperature, sometimes a plasma or catalyst reaction is concurrently used, and such a method is called Plasma-Enhanced CVD (PECVD) or Cat-CVD respectively. Such CVD features a small degree of film formation defectiveness and is mainly applied to a manufacturing process of semiconductor devices, such as formation of a gate-insulating film.

In recent years, Atomic Layer Deposition (ALD) method has drawn attention. ALD is a method in which a substance adsorbed onto a substrate surface is formed into films layer-by-layer at an atomic level by means of a chemical reaction caused on the surface, and is categorized as a CVD process. A difference between ALD and general CVD is that the so-called CVD (a general CVD) grows thin films by reacting a single gas on a substrate or by simultaneously reacting a plurality of gases on a substrate. On the other hand, ALD is a special film formation method that alternately uses highly-active gas which is called Tri-Methyl Aluminum (TMA) or a precursor and a reactive gas (also called a precursor in ALD) to grow thin films layer-by-layer at an atomic level by means of adsorption caused on the substrate surface and a chemical reaction following the adsorption.

Specifically, a film is formed as follows by ALD. During the surface adsorption caused on the substrate surface, if the surface is covered with a certain type of gas, a so-called self-limiting effect by which the gas is no longer being adsorbed is utilized to discharge unreacted precursors at a point in time when the precursors have been adsorbed onto only one layer. Thereafter, a reactive gas is injected to oxidize or reduce the above precursors and to obtain only one layer of a thin film having a desired composition, and then the reactive gas is discharged. The above treatment is regarded as one cycle, and this cycle is repeated to grow thin films. Accordingly, in an ALD process, thin films grow in a two-dimensional manner. Needless to say, a degree of film formation defectiveness is smaller in the ALD process than in the conventional vacuum deposition, sputtering, and the like than in the general CVD process and the like, and this is the feature of ALD. Consequently, ALD is expected to be widely applied to various fields including the fields of packing foods, pharmaceutical products or electronic parts.

ALD also includes a method that uses plasma for enhancing a reaction in a step of decomposing second precursors and reacting these with a first precursor having been adsorbed onto the substrate. This method is called Plasma-Enhanced ALD (PEALD) or simply called plasma ALD.

The technique of ALD was proposed by Dr. Tuomo Sumtola from Finland in 1974. Generally, since a high-quality and high-density film can be formed by ALD, this method is being increasingly applied to the field of semiconductors such as gate-insulating films, and International Technology Roadmap for Semiconductors (ITRS) also describes this method. Moreover, ALD has a feature in that this method does not provide an oblique shadow effect (a phenomenon in which sputtering particles obliquely enter the substrate surface and thus cause unevenness during film formation) compared to other film formation methods. Accordingly, a film can be formed as long as there is a space into which a gas is injected. Therefore, ALD is expected to be applied not only to coating films of lines and holes on a substrate having a high aspect ratio which indicates a high ratio between the depth and the width, but also to the field relating to Micro Electro Mechanical Systems (MEMS) for coating films of three-dimensional structures.

However, ALD also has faults. That is, for example, special materials are used to perform ALD, and accordingly, the cost increases. However, the biggest fault thereof is the slow film formation speed. For example, the film formation speed thereof is 5 to 10 times slower than that of general film formation methods such as vacuum deposition or sputtering.

As described above, a thin film formed by means of ALD using the above film formation methods can be applied to small plate-like substrates such as wafers or photomasks; inflexible substrates having a large area, such as glass plates; flexible substrates having a large area, such as films; and the like. Regarding equipment for mass-producing such thin films on these substrates according to the use thereof, various substrate-handling methods have been proposed according to the cost, ease of handleability, the quality of formed film, and the like, and have been put to practical use.

For example, a sheet-type film formation apparatus is known that forms a film for a wafer by a sheet of substrate being supplied to the apparatus and then forms a film again on the next substrate replaced, a batch-type film formation apparatus in which a plurality of substrates are set together such that the same film formation processing is performed on all the wafers, or the like.

In addition, regarding an example of forming a film on a glass substrate or the like, an inline-type film formation apparatus is known that forms a film while sequentially transporting substrates to a portion as a source of film formation. Moreover, a coating film formation apparatus is known using a so-called roll-to-roll process in which a substrate, which is mainly a flexible substrate, is wound off and transported from a roller to form a film and the substrate is wound around another roller. This apparatus also includes a web coating film formation apparatus that continuously forms a film by loading not only a flexible substrate but also a substrate on which a film is to be formed on a flexible sheet which can be continuously transported or on a tray of which a portion is flexible.

Regarding the film formation methods or substrate-handling methods used by any of the film formation apparatuses, a combination of the film formation apparatuses that yields the highest film formation speed is employed in consideration of the cost, quality, or ease of handleability.

Moreover, as a related technique, a technique of performing ALD to form a gas permeation barrier layer on a plastic substrate or a glass substrate has been disclosed (for example, see Published Japanese Translation No. 2007-516347 of the PCT International Publication). According to this technique, a light-emitting polymer is loaded on a plastic substrate having flexibility and light permeability, and ALD (top coating) is performed on the surface and the lateral surface of the light-emitting polymer.

As a result, it is possible to reduce coating defectiveness, and a light-permeable barrier film that can substantially reduce a degree of gas permeation in a thickness of tens-of-nanometers can be realized.

As described above, conventionally, laminate bodies in which an atomic layer deposition film is disposed on the outer surface of a base material by means of ALD are known, and these laminate bodies are preferably used for gas barrier films and the like having gas barrier properties. However, the present inventors conducted research and found that in the conventionally known laminate body, an atomic layer deposition film is laminated on a polymeric base material, and the form of growth thereof is highly likely to differ from the form of growth when inorganic crystals such as in the conventional Si wafer are used as a base material. When a substrate obtained by performing oxidation treatment on a Si wafer is used, the density of adsorption sites of the precursors is almost the same as that of the crystal lattice. In many cases, while the atomic layer deposition is being performed by several cycles, after the period of three-dimensional growth (island growth), the film grows in a two-dimensional growth mode. However, it was found that in the case of a polymeric base material, the density of distributed adsorption sites of the precursors is low, the precursors which are adsorbed in a state of being isolated function as nuclei to promote the three-dimensional growth, and an adjacent nucleus comes into contact with the precursors, thereby forming a continuous film. That is, these findings mean that in the growth of the atomic layer into a polymeric base material, the period of three-dimensional growth to form a continuous film is long, the period in which the continuous film becomes a dense film by two-dimensional growth is long, and a dense portion of the atomic layer deposition film that is formed by the two-dimensional growth is decreased. In view of gas barrier properties, the fact that the portion of the two-dimensional growth is small is not preferable. In other words, the conventional laminate body described above may not have ideal gas barrier properties.

Moreover, as described above, since it takes a long time for two-dimensional growth to occur, the portion of the three-dimensional growth that has a low density increases. Accordingly, not only is the binding density lowered, but also the portion of the atomic layer deposition film that has a low mechanical strength increases, whereby the adhesive strength is highly likely to be lowered.

The present invention has been made in consideration of the above circumstances, and an object thereof is to provide a laminate body and a gas barrier film having a high degree of gas barrier properties and a method of manufacturing the laminate body and the gas barrier film.

SUMMARY OF THE INVENTION

A first aspect of the present invention is a laminate body including a base material, a membrane-like or film-like undercoat layer that is formed on at least one portion of the outer surface of the base material, and an atomic layer deposition film that is formed on a surface opposite to a surface coming into contact with the base material, among both surfaces of the undercoat layer in the thickness direction, in which at least a portion of precursors of the atomic layer deposition film bind to the undercoat layer, and the atomic layer deposition film is formed into a membrane shape that covers the undercoat layer.

The undercoat layer may include a binder and an inorganic substance, and at least a portion of precursors of the atomic layer deposition film may bind to the inorganic substance included in the undercoat layer.

The binder may be an organic binder, and a main component of the undercoat layer may be the inorganic substance.

The binder may be an inorganic binder, and a main component of the undercoat layer may be the inorganic substance.

The binder may be a hybrid binder as a mixture of an organic substance and an inorganic substance, and a main component of the undercoat layer may be the inorganic substance.

At least a portion of the inorganic substance may be exposed on the surface opposite to the surface coming into contact with the base material, and the precursors of the atomic layer deposition film may bind to the outer surface of the exposed inorganic substance.

The inorganic substance may be inorganic particles having a particle shape.

The inorganic substance may be a layered compound having a layered structure.

The inorganic substance may be a polymer in a form of a sol or gel.

The undercoat layer may include an organic polymer, and at least a portion of the precursors of the atomic layer deposition film may bind to functional groups of the organic polymer included in the undercoat layer.

A main component of the undercoat layer may be the organic polymer.

The functional groups of the organic polymer may have an O atom.

The functional groups having an O atom may be one of OH groups, COOH groups, COOR groups, COR groups, NCO groups, and $SO_3$ groups.

The functional groups of the organic polymer may have an N atom.

The functional groups having an N atom may be $NH_X$ (X is an integer) groups.

At least a portion of the surface of the undercoat layer that is opposite to the surface coming into contact with the base material may be treated with surface treatment by plasma treatment or hydrolytic treatment so as to increase the density of the functional groups of the organic polymer.

The undercoat layer may include an inorganic substance, at least in the surface opposite to the surface coming into contact with the base material.

A second aspect of the present invention is a gas barrier film obtained by forming the laminate body of the first aspect into a film shape.

A third aspect of the present invention is a method of manufacturing a laminate body, including a first step of loading a base material; a second step of forming a membrane-like or film-like undercoat layer including a binder and an inorganic substance in at least a portion of the outer surface of the base material loaded by the first step; a third step of removing at least a portion of the binder which is exposed on the surface opposite to the surface coming into contact with the base material, among both surfaces of the undercoat layer formed by the step 2 in the thickness direction, and exposing at least a portion of the inorganic substance on the surface of the undercoat layer; and a fourth step of forming the atomic layer deposition film on the surface opposite to the surface coming into contact with the base material, among both surfaces of the undercoat layer in the thickness direction such that the precursors of the atomic layer deposition film bind to the inorganic substance exposed by the third step.

In the third step, a portion of the binder may be removed by plasma etching.

A fourth aspect of the present invention is a method of manufacturing a laminate body, including a first step of loading a base material; a second step of forming a membrane-like or film-like undercoat layer including an organic polymer in at least a portion of the outer surface of the base material loaded by the first step; a third step of performing surface treatment on a portion of the surface opposite to the surface coming into contact with the base material among both surfaces of the undercoat layer formed by the second step in the thickness direction so as to realize a high density of functional groups of the organic polymer; and a fourth step of forming the atomic layer deposition film on the surface opposite to the surface coming into contact with the base material among both surfaces of the undercoat layer in the thickness direction, such that the precursors of the atomic layer deposition film bind to the functional groups of the organic polymer that obtains a high density by the third step.

In the third step in the fourth aspect, surface treatment may be performed on the undercoat layer by plasma etching or hydrolytic treatment to realize a high density of the functional groups of the organic polymer.

A fifth aspect of the present invention is a method of manufacturing a gas barrier film in which the laminate body manufactured by the method of manufacturing a laminate body according to the third or fourth aspect is formed into a film shape.

The laminate body and the gas barrier film of the present invention have a high degree of gas barrier properties. Moreover, according to the method of manufacturing a laminate body and gas barrier film of the present invention, a laminate body and a gas barrier film having a high degree of gas barrier properties can be manufactured.

BRIEF DESCRIPTION OF THE DRAWINGS

FIG. 3 is a view comparing a laminate body with a gas barrier layer of the present example with a laminate body without a gas barrier layer of a comparative example, in terms of a water vapor transmission rate.

FIG. 15 is a view comparing a laminate body with an undercoat layer of the present example with a laminate body without an undercoat layer of a comparative example, in terms of a water vapor transmission rate.

DETAILED DESCRIPTION OF THE PREFERRED EMBODIMENTS

First Embodiment

Figure 1:
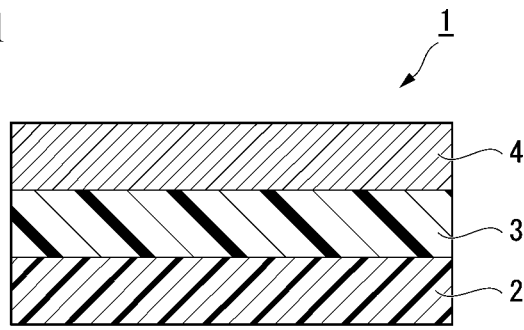
FIG. 1 is a cross-sectional view showing the structure of a laminate body according to the first embodiment of the present invention.

The first embodiment of the present invention will be described.

The laminate body according to the present invention includes an undercoat layer between a base material and an atomic layer deposition film. The undercoat layer is a layer in which an inorganic substance has dispersed. Moreover, a precursor of the atomic layer deposition film is a gaseous substance and can easily bind to an inorganic substance exposed on the surface of the undercoat layer. Since a large amount of inorganic substances are exposed on the surface of the undercoat layer, the precursors of the atomic layer deposition film that have bound to the respective inorganic substance bind to one another. As a result, an atomic layer deposition film having a two-dimensional shape that grows in the surface direction of the undercoat layer is formed. Accordingly, a space that allows gas to permeate in the film thickness direction of the laminate body is not easily formed, and a laminate body having a high degree of gas barrier properties can be realized.

Since the laminate body is provided with the undercoat layer, the density of adsorption sites of the precursors increases. Therefore, the density of binding between the atomic layer deposition film and the undercoat layer is improved, and the adhesive strength of the atomic layer deposition film with respect to the undercoat layer and the base material is enhanced.

<<Approach to the Present Invention>>

A laminate body having an atomic layer deposition film manufactured by Atomic Layer Deposition (ALD) is being commercially produced as a substrate for electronic parts such as a glass substrate or a silicon substrate for a thin wireless EL film, a display, a semiconductor memory (DRAM), and the like. Meanwhile, the base material of the laminate body that the present invention deals with is a flexible polymer base material. However, in the current circumstances, detailed research on the ALD process for a polymer base material is not being conducted. Therefore, on the assumption that the atomic layer deposition film may grow on a polymer base material as on a substrate for electronic parts, the present inventors tried to make an approach to the laminate body of the present invention while considering the growth process of the atomic layer deposition film in a polymer base material.

Generally, the atomic layer deposition film on a substrate for electronic parts is considered to grow two-dimensionally, but actually, the atomic layer deposition film on a polymer base material (for example, PET: polyethylene terephthalate) does not grow two-dimensionally. In other words, if a thin atomic layer deposition film is formed by an ALD process on a polymer base material, the two-dimensional growth intrinsic to the ALD may not be performed, and it is considered that this is caused mainly by the "density of adsorption sites" and the "disposition of adsorption sites" on a polymer substrate. For these reasons, the atomic layer deposition film does not sufficiently exhibit the performance if the film is thin. Consequently, the thickness of the atomic layer deposition film needs to be 3 nm, or the film needs to consist of 30 or more atomic layers.

Regarding the density of adsorption sites, which is the first reason, of precursors in the ALD, the following can be considered. That is, as a first step of the ALD process, a gaseous precursor (TMA: Tri-Methyl Aluminum or a metal-including precursor such as $TiCl_4$) is chemically adsorbed onto the surface of a polymer base material (hereinafter, simply called a "base material"). At this time, the reactivity between the precursor and functional groups of the base material as well as the density of the functional groups exert a great influence on the chemical adsorption.

For example, in the case of a polymer, as shown in the following Formula (1), the precursors of the atomic layer deposition film are adsorbed onto adsorption sites.

$$R\text{—}OH + Al(CH_3)_3 \rightarrow R\text{—}O\text{—}Al(CH_3)_3 + CH_4\uparrow \qquad (1)$$

That is, in Formula (1), the precursors are adsorbed onto OH groups present in the polymer chain.

The precursors of the atomic layer deposition film can be adsorbed onto the functional groups such as OH or COOH groups of the polymer chain but cannot be adsorbed onto non-polar portions such as an alkyl group. Therefore, in order to increase the adsorption force of the precursors, plasma treatment is performed using gas including $O_2$ or $N_2$, whereby the functional groups are introduced into the surface of the polymer base material. However, depending on the type of the polymer, the polymer chain is cut by the plasma treatment in some cases. In the portion where the polymer chain is cut as above, physical strength decreases, the portion has a weak cohesive force and forms a weak boundary layer (boundary layer having a week cohesive force), and this leads to a decrease in the adhesive strength. Accordingly, the plasma treatment for introducing functional groups into the surface of the polymer base material has a limitation in terms of the adhesive strength.

When the density of the functional groups is low, each of the adsorption sites of the precursors is disposed in a state of being isolated. When the adsorption site is disposed in a state of being isolated, the atomic layer deposition film grows three-dimensionally by using the adsorption site as a nucleus. That is, if the density of the adsorption sites is low, the atomic layer deposition film widens three-dimensionally by the precursors, and the precursors are sparsely adsorbed onto a site such as OH, and accordingly, the atomic layer deposition film grows into a columnar shape around the isolated nucleus as a center.

The atomic layer deposition film having grown from the isolated nucleus is highly likely to have a low binding density with the base material and a low degree of adhesiveness.

Next, regarding the disposition of adsorption sites (that is, diffusion of precursors) as the second reason, the following can be considered. It is generally considered that in a polymer film, a crystalline area is mixed with an amorphous area. Therefore, in the amorphous area, there is a space which is called a free volume and is free of a polymer chain, and gas is diffused and transmitted through this space. Moreover, gaseous precursors are transmitted through the space of free volume until they are adsorbed onto the adsorption sites.

For the above reasons, in the ALD process that deals with a polymer base material, the precursors diffuse from the surface of the polymer substrate to the inside of the base material and are adsorbed onto the functional groups having dispersed three-dimensionally, whereby the adsorption sites become nuclei of the atomic layer deposition film. Since these nuclei disperse three-dimensionally, a three-dimensional growth mode continues until a nucleus comes into contact with the adjacent nucleus to form a continuous film. Consequently, this means that the period from the formation of a continuous film to the formation of a dense film by means of two-dimensional growth is long, and the dense portion, which is formed by two-dimensional growth, of the atomic layer deposition film is small. Therefore, gas passes through the space of the atomic layer deposition film and also passes through the space of free volume. Accordingly, a high degree of gas barrier properties is not obtained.

Moreover, as described above, the period until the two-dimensional growth occurs is long, and thus the three-dimensionally growing portions having a low density increase. Accordingly, not only the binding density but also the adhesive strength are highly likely to decrease since the portion having a low mechanical strength increases in the atomic layer deposition film.

Therefore, in the present embodiment, in order to realize (1) improvement of the density of adsorption sites of precursors and (2) prevention of diffusion of precursors to the polymer base material, an undercoat layer including an inorganic substance is disposed on the polymer base material. That is, in order to two-dimensionally dispose adsorption sites of the precursors on the surface of the polymer base material at a high density, prior to the ALD process, an undercoat layer including an inorganic base material is disposed on the polymer base material. Moreover, in order to improve the density of the adsorption sites of the precursors, the adsorption sites of an inorganic substance having a high density are utilized. If an undercoat layer including an inorganic substance (inorganic compound) is disposed on the polymer substrate in this manner, the gas including the precursors is not easily transmitted through the undercoat layer including the inorganic substance.

In addition, since the density of the adsorption sites is improved, the adhesiveness of the atomic layer deposition layer with respect to the undercoat and the base material is enhanced.

<Structure of Laminate Body>

FIG. 1 is a cross-sectional view showing the structure of a laminate body according to the embodiment of the present invention. As shown in FIG. 1, a laminate body 1 includes a base material 2 formed of a polymer material, a membrane-like or film-like undercoat layer (hereinafter, called UC layer) 3 formed on the surface of the base material 2, and an atomic layer deposition film (hereinafter, called an ALD film) 4 formed on a surface opposite to a surface coming into contact with the base material 2 among both surfaces of the UC layer 3 in the thickness direction. The UC layer 3 has a structure in which an inorganic substance (inorganic material) has been added to a binder. Moreover, the precursors of the ALD film 4 bind to the inorganic substance included in the UC layer 3, whereby the ALD film 4 is formed into a membrane shape to cover the UC layer 3.

Herein, the feature of the UC layer 3 will be described. The UC layer 3 is formed of a binder and an inorganic substance (inorganic material). At this time, unlike a polymer, the inorganic substance has a small free volume. In addition, since the inorganic substance does not have a glass transition as the polymer does, the properties thereof do not change even in a high-temperature process. That is, an amorphous portion of the polymer starts to exhibit Brown movement at a temperature equal to or higher than a glass transition thereof, and the gas diffusion speed increases in the free volume. However, in the inorganic substance, such a phenomenon caused by the glass transition is not observed.

The inorganic substance used for the UC layer 3 is a layered compound. Accordingly, such an inorganic substance as a layered compound is aligned approximately in parallel with the coating surface of the base material 2. In addition, in the ALD film 4, all the gas including the precursors cannot diffuse to the inside of the inorganic substance as a layered compound.

Moreover, if necessary, the surface of the UC layer 3 is etched such that the surface of the inorganic substance as a layered compound is exposed. That is, plasma treatment is performed to introduce desired functional groups into the surface of the inorganic substance as a layered compound in the UC layer 3 exposed on the base material 2, whereby the surface of the UC layer 3 is etched.

When the UC layer 3 having the above properties is disposed on, for example, the surface of the polymeric base material 2, the adsorption sites of the precursors are disposed at a high density on the surface of the base material 2. Furthermore, the inorganic substance as a layered compound in the UC layer 3 is disposed in parallel with the surface of the base material 2. Consequently, since the UC layer 3 virtually uniformly covers the surface area of the base material 2, the adsorption sites are two-dimensionally disposed, whereby two-dimensional growth of the ALD film 4 is promoted. Moreover, in the UC layer 3, even when the process temperature of ALD for forming the ALD film 4 becomes high, the portion of the inorganic substance as a layered compound does not experience glass transition as a general plastic polymer does, hence the ALD film 4 stably grows.

The binder of the UC layer 3 may be any of an organic binder, an inorganic binder, and a hybrid binder as a mixture of organic and inorganic binders.

According to the laminate body 1 constituted as above, the inorganic substance as a layered compound is exposed on the surface of the UC layer 3 facing the ALD film 4. Therefore, the precursors of the ALD film 4 bind to the outer surface of the inorganic substance. Particularly, if the inorganic substance is formed into particles or a layered structure, a binding force of the ALD film 4 with respect to the precursors can be strengthened. Moreover, it is preferable to form the inorganic substance into a gel or a gel-like polymer to obtain an optimal binding force.

In addition, according to the laminate body 1b of the present embodiment, functional groups are disposed on the surface at a high density. Therefore, a dense and thin film can be expected to be formed not only by ALD but also by other thin film growth methods (for example, vacuum deposition, sputtering, and CVD) in a growth mode that yields a high nuclear density.

<Manufacturing Process of Laminate Body>

The laminate body 1 shown in FIG. 1 is realized by the following manufacturing process. The manufacturing process is merely an example, and the present invention is not limited to the content thereof. That is, 1. Plasma treatment or primer treatment is optionally performed on the polymeric base material 2.

2. An undercoat material (solution) is prepared for forming the UC layer 3.

Herein, an organic binder, an inorganic binder, or a hybrid binder as a mixture of an inorganic binder and an organic binder is prepared together with an inorganic substance (for example, inorganic particles) and a solvent.

As the organic binder, polyester acrylate or urethane acrylate is used. As the hybrid binder as a mixture of an inorganic binder and an organic binder, polyvinyl alcohol and a hydrolysate of a metal alkoxide (TEOS) are used. As the inorganic binder, the hydrolysate of a metal alkoxide (TEOS) can be used.

3. Inorganic particles are prepared as an inorganic substance. At this time, as the inorganic particles, spherical inorganic particles or inorganic particles made into a layered compound are prepared.

4. By using the materials of the above sections 2 and 3, the UC layer 3 is formed by means of undercoat treatment.

5. The surface of the UC layer 3 is optionally etched.

6. The ALD film 4 is formed by Atomic Layer Deposition (ALD).

In addition, in order to accelerate two-dimensional growth of the ALD film 4, it is desirable to add a layered compound of the inorganic substance or silanol to be an adsorption site to the materials at the time of the undercoat treatment.

Figure 2:
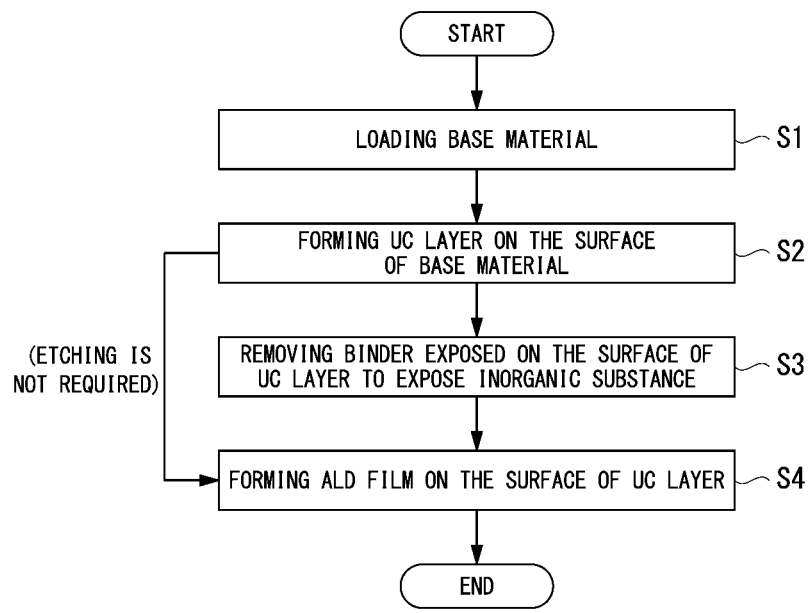
FIG. 2 is a flowchart as a summary of a manufacturing process of the laminate body shown in FIG. 1.

FIG. 2 is a flowchart illustrating a summary of a manufacturing process of the laminate body 1 shown in FIG. 1. In FIG. 2, first, the polymeric base material 2 is loaded on a thin film formation apparatus (semiconductor manufacturing apparatus or the like) (Step S1). Thereafter, on the surface of the base material 2 having been loaded on the thin film formation apparatus, the membrane-like or film-like undercoat layer (UC layer) 3 formed of a composite material consisting of a binder and an inorganic substance is formed (Step S2).

Subsequently, a portion of the binder exposed on the surface (that is, the surface opposite to the surface coming into contact with the base material 2) of the UC layer 3 formed by the Step S2 is removed to expose the inorganic substance on the surface of the inorganic substance (Step S3). Then the ALD film 4 is formed on the surface of the UC layer 3 such that the precursors of the atomic layer deposition film (ALD film 4) 4 bind to the inorganic substance exposed by the step S3 (Step S4).

In Step S3, it is desirable to remove a portion of the binder by plasma etching. That is, when an organic binder is used, the inorganic substance (inorganic particles) may be covered with the organic binder on the surface of the UC layer 3, and accordingly, the organic binder on the surface of the UC layer 3 needs to be removed by plasma etching. By performing the above Steps S1 to S4 in this manner, a dense ALD film 4 can be formed on the surface of the UC layer 3, whereby gas barrier properties of the laminate body 1 can be improved.

Each of the Steps S1 to S4 may be performed in the same apparatus or in different apparatuses. Furthermore, at a stage between the Step S3 and the Step S4, plasma treatment may be further performed on the surface of the UC layer 3 on which the inorganic substance is exposed, such that desired functional groups are introduced into the surface.

<Inorganic Substance Used for UC Layer>

Next, the inorganic compound (inorganic substance) used for the undercoat layer (UC layer) 3 will be described in detail. The inorganic substance is carefully selected in consideration of the following points. That is, factors for selecting the inorganic substance formed of inorganic particles include the shape of the inorganic particles. There may be particles having a shape close to a spherical shape or a plate-like shape, but any of the particles can be used.

Regarding a particle size (particle diameter) of the inorganic particles, an average particle diameter thereof is set to be 1 µm or less and more preferably 0.1 µm or less so as not to influence the smoothness of the base material 2. Moreover, it is desirable that the size of the inorganic particles be sufficiently smaller than the wavelength of visible rays so as not to exert influence on the optical properties (that is, light transmittance, haze: ratio of light of diffuse transmittance to the light of total transmittance) of the UC layer 3 as much as possible. When the inorganic substance is a layered compound, a compound having an aspect ratio (Z) of 50 or higher and a thickness of 50 nm or less and preferably 20 nm or less is selected. Here, provided that L is an average particle diameter, and a is a thickness of a material of the inorganic particles, $Z=L/a$.

Regarding the optical properties of the inorganic particles, in view of coating a transparent barrier, it is not preferable for the particles to be colored. Particularly, for the UC layer 3, a refractive index of the binder needs to match a refractive index of the inorganic particles. That is, in the UC layer 3, if there is a big difference between refractive indices of the binder and the inorganic particles, light is reflected to a large extent from the interface of the UC layer 3, and this leads to the decrease in the light transmittance or the increase in the haze in the UC layer 3.

Regarding dispersibility of the inorganic particles, secondary aggregation does not easily occur since the particles disperse excellently in the binder. When the inorganic substance is a layered compound, affinity (intercalation: chemical binding) with the binder is excellent.

Regarding stability of the inorganic particles, if the laminate body 1 is used as a solar cell, the laminate body 1 is assumed to be used for 20 to 30 years, hence the inorganic substance needs to be chemically stable even if the laminate body 1 is used for a long time at a high temperature, a high humidity, and an extremely low temperature. Further, regarding safety of the inorganic substance, the substance should not cause environmental harm at various stages including the manufacturing process of the laminate body 1, usage time thereof, and disposal treatment thereof.

<Type of Inorganic Substance>

When the inorganic substance used for the UC layer 3 is made into inorganic particles, among candidates of the materials, halloysite, calcium carbonate, silicic anhydride, hydrous silicic acid, alumina, and the like which have a particle diameter larger than that of candidates of extender pigments, for example, kaolinite as a type of viscous mineral are exemplified as the inorganic substance. In addition, when the inorganic substance is made into a layered compound, examples thereof include artificial clay, fluorphlogopite, fluorine-4-silicon mica, taeniolite, fluorine vermiculite, fluorine hectolite, hectolite, sapolite, stevensite, montmorillonite, beidellite, kaolinite, fraipontite, graphene and derivatives thereof, and the like.

The graphene and derivatives thereof are selected in consideration of the affinity thereof with a solvent as a binder. For example, when a binder as an aqueous solvent of PVA or acryl is used, an alcohol dispersion of graphene (manufactured by Incubation Alliance Inc., GF3IPA-D1), an aqueous dispersion thereof (manufactured by Incubation Alliance Inc., GF3W1-D1), or an aqueous dispersion of a graphene oxide (manufactured by Angstone Materials Inc., N002-PS and the like) may be selected. For an organic solvent-based binder, flake-like graphene (manufactured by Angstone Materials Inc., N002-PDR and the like) may be used by being appropriately dispersed in a solvent.

The coating method at the time when the graphene and derivatives thereof are used as an inorganic substance is appropriately selected from bar coating, roll coating, slot die coating, gravure coating, and the like, in consideration of the solid content of the coating liquid, desired coating amount, suitability such as uniformity, and the like. Moreover, when the graphene and derivatives thereof are compounded with the binder, the materials can be selected by the above method as long as the materials are excellent in mixing properties.

As layered viscous minerals, inorganic substances such as pyrophyllite, talc, montmorillonite (overlapped with artificial clay), beidellite, nontronite, saponite, vermiculite, sericite, glauconite, celadonite, kaolinite, nacrite, dickite, halloysite, antigorite, chrysotile, amesite, cronstedtite, chamosite, chlorite, allevardite, corrrensite, and tosudite can be used as the layered compound.

Inorganic particles (spherical particles) other than extender pigments include metal oxides such as zirconia and titania as polycrystalline compounds, metal oxides which are represented by a general chemical formula $MM'O_x$ or the like and include two or more kinds of metal atoms (M, M', . . . ), such as barium titanate and strontium titanate, and the like.

<Specific Examples of Inorganic Particles>

Next, specific examples of commercially available inorganic particles used for the UC layer 3 will be described. As the inorganic particles used for the UC layer 3, the following silica particles are generally used.

Colloidal silica: SNOWTEX XS (registered trademark) manufactured by NISSAN CHEMICAL INDUSTRIES, LTD.

This colloidal silica is an ultrafine particle-based silica sol stabilized with Na and has a $SiO_2$ content of 30%, a particle diameter of 4 to 6 nm, pH of 9.0 to 10, and viscosity of 1.0 to 7.0 mPa·s.

Organosilica sol: MEK-ST (registered trademark) manufactured by NISSAN CHEMICAL INDUSTRIES, LTD This organosilica sol is a methyl ethyl ketone-dispersed silica sol and has a $SiO_2$ content of 30%, a particle diameter of 10 to 20 nm, viscosity of 1.0 to 5.0 mPa·s, and a moisture content of 0.5% or less.

Reactive deformed fine silica particles: DPIO39SIV (registered trademark) manufactured by JGC C&C These reactive deformed fine silica particles have an average primary particle diameter of 20 nm, an average connectivity number of 3.5, an average secondary particle diameter of 55 nm, a solid content of 30% and include an MIBK solvent, and a photocurable group or a methacryloyl group.

Reactive fine silica particles: MIBK-SD (registered trademark) manufactured by NISSAN CHEMICAL INDUSTRIES, LTD These reactive fine silica particles have an average primary particle diameter of 12 nm, a solid content of 30% and include an MIRK solvent and a photocurable group or a methacryloyl group.

<Specific Examples of Layered Compound of Inorganic Substance>

Next, specific examples of the layered compound of the inorganic substance used for the UC layer 3 will be described. As the layered compound of the inorganic substance, montmorillonite is used. That is, montmorillonite is a type of mineral (silicate mineral) that belongs to a smectite group. Montmorillonite is a monoclinic mineral having a chemical composition of $(Na, Ca)0.33(Al,Mg)2SiO_4O_{10}(OH)_2.nH_2O$. The montmorillonite is a type of viscous mineral and is included in rocks having undergone hydrothermal alteration. Among montmorillonites included in those rocks, a material having a property of turning wet litmus paper red is called acid clay. The name "montmorillonite" came from Montmorillon, a province of France in 1847. Various properties of montmorillonite are described in the "Additional note" which will be described later.

<Organic Binder Used for UC Layer>

Next, the organic binder used for the UC layer 3 will be described. The organic binders used for the UC layer 3 are classified into aqueous organic binders and solvent-based organic binders depending on the type of a solvent to be used. Examples of the aqueous organic binders include polyvinyl alcohol, polyethylenimine, and the like. Examples of the solvent-based organic binders include acrylic ester, urethane acryl, polyester acryl, polyether acryl, and the like.

Next, more specific examples of the organic binders used for the UC layer 3 will be described.

1. Organic Binder of O Atom-including Resin

The following materials are preferable as the organic binder of an O atom-including resin. As hydroxyl group (OH) group-including resins, there are polyvinyl alcohol, phenol resins, polysaccharide, and the like. The polysaccharide includes cellulose, cellulose derivatives such as hydroxymethyl cellulose, hydroxyethyl cellulose, and carboxymethyl cellulose, chitin, chitosan, and the like. Moreover, as carbonyl group (COOH)-including resins, a carboxyvinyl polymer and the like are also preferable materials.

The organic binder of an O atom-including resin other than the above includes polyketone, polyether ketone, polyether ether ketone, aliphatic ketone, and the like of a ketone group (CO)-including resin. In addition, a polyester resin, a polycarbonate resin, a liquid crystal polymer, polyethylene terephthalate (PET), polybutylene terephthalate (PBT), polyethylene naphthalate (PEN), polybutylene naphthalate (PBN), polytrimethylene terephthalate (PTT), and the like of an ester group (COO)-including resin can also be used. Moreover, an epoxy-based resin, an acrylic resin, and the like including the above functional groups may be used.

2. Organic Binder of N Atom-including Resin

The following materials are preferable as the organic binder of an N atom-including resin. The materials include polyimide, polyetherimide, polyamideimide, alicyclic polyimide, solvent-soluble polyimide, and the like of an imide group (CONHCO)-including resin. Regarding the alicyclic polyimide, though aromatic polyimide is generally obtained from an aromatic tetracarboxylic acid anhydride and an aromatic diamine, this type of polyimide does not have transparency. Therefore, in order to obtain transparent polyimide, an acid dianhydride or a diamine can be substituted with an aliphatic or alicyclic group. Alicyclic carboxylic acid includes 1,2,4,5-cyclohexane tetracarboxylic acid, 1,2,4,5-cyclopentane tetracarboxylic dianhydride, and the like. The solvent-soluble polyimide includes γ-butyrolactone, N,N-dimethylacetamide, N-methyl-2-pyrrolidone, and the like.

Preferable materials of the organic binder of an N atom-including resin include nylon-6, nylon-6,6, a meta-xylene diamine-adipic acid polycondensate, polymethyl methacrylimide, and the like of an amide group (NHCO)-including resin. The materials also include a urethane resin of an isocyanate group (NHCOO)-including resin and the like. The urethane resin can also be used as an adhesive layer. In addition, an amino group (NH)-including resin can also be used.

3. Organic Binder of S Atom-including Resin

The following materials can be used as the organic binder of an S atom-including resin. That is, the materials include polyether sulfone (PES), polysulfone (PSF), polyphenyl sulfone (PPS), and the like of a sulfonyl group $(SO_2)$-including resin. Among these, PES and PSF are materials having a high degree of heat resistance. Moreover, a polymer alloy, a polybutylene terephthalate-based polymer alloy, polyphenylene sulfide-based polymer alloy, and the like can be used as the organic polymer. The polymer alloy may optionally make the above polymers into a polymer complex (alloy, blend, or composite).

<Hybrid Binder as a Mixture of Organic Binder and Inorganic Binder and Inorganic Binder Used for UC Layer>

The hybrid binder as a mixture of an organic binder and an inorganic binder as well as an inorganic binder that are used for the UC layer 3 include a metal alkoxide (a precursor of the inorganic compounds) which is represented by General formula R1(M-OR2). Here, R1 and R2 are organic groups having 1 to 8 carbon atoms, and M is a metal atom. Moreover, the metal atom M includes Si, Ti, Al, Zr, and the like.

Examples of compounds which include Si as the metal atom M and are represented by R1(Si—OR2) include tetramethoxysilane, tetraethoxysilane, tetrapropoxysilane, tetrabutoxysilane, methyltrimethoxysilane, methyltriethoxysilane, dimethyldimethoxysilane, dimethyldiethoxysilane, and the like.

Examples of compounds which include Zr as the metal atom M and are represented by R1(Zr—OR2) include tetramethoxyzirconium, tetraethoxyzirconium, tetraisopropoxyzirconium, tetrabutoxyzirconium, and the like.

Examples of compounds which include Ti as the metal atom M and are represented by R1(Ti—OR2) include tetramethoxytitanium, tetraethoxytitanium, tetraisopropoxytitanium, tetrabutoxytitanium, and the like.

Examples of compounds which include Al as the metal atom M and are represented by R1(Al—OR2) include tetramethoxyaluminum, tetraethoxyaluminum, tetraisopropoxyaluminum, tetrabutoxyaluminum, and the like.

<Additional Note>

Next, the montmorillonite used as a layered compound of the inorganic substance in the UC layer 3 will be described in detail. The montmorillonite as a main component of bentonite is a viscous material categorized into smectite as a type of layered silicate mineral. The montmorillonite has a crystal structure in which three layers including a tetrahedral silicate layer, an octahedral alumina layer, and a tetrahedral silicate layer are stacked on each other, and the unit layer has a shape of an extremely thin plate having a thickness of about 10 Å (1 nm) and a width of about 0.1 to 1 µm.

A portion of Al atoms as central atoms of the octahedral alumina layer is substituted with Mg, and this leads to lack of positive charge, whereby each crystal layer itself is negatively charged. However, if cations such as Na+, K+, Ca+, Mg+, and the like are interposed between the crystal layers, the state of lack of charge is mitigated, whereby the montmorillonite is stabilized. Accordingly, the montmorillonite is in a state where the crystal layers have been stacked on each other over and over. The negative charge on the surface of the layer and the interlayer cations work in various ways, and accordingly, the properties specific to the montmorillonite are exhibited.

Regarding ion-exchange properties of the montmorillonite, since the binding force between the negative charge on the surface of the unit layer of the montmorillonite and the interlayer cations is weak, if a solution including other ions is used as a catalyst, the interlayer cations react with cations in the solution in a moment, whereby ion exchange occurs. If the amount of cations discharged into water is measured, the amount of charge of the montmorillonite that is involved in the reaction (that is, Cation Exchange Capacity: CEC) can be determined. The cation exchange capacity varies with the pH or concentration of the solution, and it is known that the cation exchange capacity of montmorillonite increases at a pH of 6 or higher.

Regarding adsorptivity of the montmorillonite, montmorillonite has an extremely large surface area since it has a layered structure. Therefore, with such a surface area, if the surface of the layer forms a hydrogen bond with oxygen atoms or hydrogen groups, and electrostatic binding or the like is caused between layers through the interlayer negative charge or the interlayer cations, adsorptivity is exerted. The montmorillonite easily acts particularly on polar molecules.

Regarding swelling properties of the montmorillonite, when the montmorillonite comes into contact with water, water is adsorbed onto it, whereby the montmorillonite expands (swells). This is caused by the interaction between the interlayer cations and water molecules. Since the binding force between the negative charge on the surface of a unit area of the montmorillonite and the interlayer cations is weaker than the energy of the interaction between the interlayer cations and water molecules, the mechanism of swelling, in which the space between layers is pushed and widens due to the force by which the interlayer cations attract water molecules, is provided. Basically, when the interaction between the interlayer cations and water molecules reaches the limit, swelling ends.

Regarding viscosity of the montmorillonite, the montmorillonite is stabilized in a state where layers thereof are stacked on each other over and over. The end of the structure carries a positive charge, and the side thereof carries a negative charge. When the montmorillonite is dispersed in water, the layers thereof undergo electrostatic binding to form a card house structure (steric structure formed by electrical coupling). The force working to form the card house structure becomes a resistance, whereby the montmorillonite dispersion obtains viscosity. Moreover, the dispersion turns into a gel when the montmorillonite is dispersed to such a degree that forms the card house structure, and if a shearing force is applied thereto, the dispersion returns to the viscous dispersion. This is a mechanism of thixotropy.

Next, organophilized bentonite of the montmorillonite will be described. If an organization agent is inserted between layers of the montmorillonite by utilizing the cation-exchange properties of the mineral to makes it possible for the montmorillonite to be dispersed in an organic solvent or a resin, an organophilized bentonite is obtained. As the organization agent, a quaternary ammonium salt such as a dimethyl distearyl ammonium salt or a trimethyl stearyl ammonium salt is generally used. Depending on the circumstance of the use, an ammonium salt including a benzyl group or a polyoxyethylene group may be used, or a phosphonium salt, an imidazolium salt, or the like may be used instead of the ammonium salt in some cases.

EXAMPLES

Next, specific examples of the laminate body which is realized based on the above embodiment and includes a gas barrier film formed of an atomic layer deposition film will be described.

<Method for Forming Gas Barrier Layer>

On the upper surface of the UC layer disposed on a polymer substrate, a $TiO_2$ film is formed by means of ALD. At this time, titanium tetrachloride (TiCl4) is used as raw material gas. $N_2$ as process gas is supplied into a film formation chamber simultaneously with the raw material gas. In addition, $N_2$ as purge gas and $O_2$ as plasma process gas and also as reactant gas are supplied into the film formation chamber. A treatment pressure at this time is controlled to be 10 to 50 Pa. Moreover, as a power source for exciting plasma gas, a power source of 13.56 MHz is used, and plasma discharge is performed in an ICP mode.

TiCl4 and the process gas are supplied for 60 msec, the purge gas is supplied for 10 sec, and $O_2$ as the plasma process gas and also as the reactant gas is supplied for 3 sec. Further, while $O_2$ as the plasma process gas and also as the reactant gas is being supplied, plasma discharge is caused in an ICP mode. At this time, the output power of plasma discharge is controlled to be 250 W. Moreover, in order to perform gas purging after the plasma discharge, $O_2$ and $N_2$ as purge gas are supplied for 10 sec. The film formation temperature at this time is controlled to be 90° C.

The $TiO_2$ film formation speed under the above cycle conditions is as follows. That is, since a unit film formation speed is 0.9 Å/cycle, when a film having a thickness of 10 nm is formed by performing 110 cycles of film formation treatment, about 43 minutes is taken in total for forming the film.

<Plasma Etching>

The upper surface of the UC layer disposed on a polymer substrate is loaded on a plasma asher apparatus, and the binder on the surface of the UC layer is etched by oxygen plasma to expose the inorganic substance included in the UC layer on the surface. The state of exposure is observed with a Scanning Electron Microscope (SEM). As the etching conditions, a barrel-type plasma asher apparatus is used, and an output of RF plasma (13.56 MHz) at this time is 500 W, a flow rate of oxygen gas is 300 sccm, and a pressure is 50

Pa. The etching time is determined by confirming the exposure state of the inorganic substance.

<Water Vapor Transmission Rate of Gas Barrier Layer>

Next, regarding experimental results of a water vapor transmission rate of the laminate body which is realized based on the above embodiment and includes the gas barrier layer, several examples will be described. These experimental results of the respective examples are in regard to the gas barrier properties of the laminate body realized by the above embodiment and are obtained by measuring a water vapor transmission rate in an atmosphere of 40° C./90% RH by using a water vapor transmission analyzer (MOCON Aquatran (registered trademark) manufactured by Modern Controls, Inc.). FIG. 3 is a view comparing a laminate body with a gas barrier layer of the present example with a laminate body without a gas barrier layer of a comparative example in terms of a water vapor transmission rate. Accordingly, the superiority of the respective examples will be described with reference FIG. 3.

<Lamination>

The laminate body which is realized based on the above embodiment and has the gas barrier layer is laminated on another stretched polyethylene terephthalate (PET) film by using an adhesive, and a peeling strength of the resultant obtained by lamination is measured. Prior to the lamination, the stretched polyethylene terephthalate (PET) film (thickness of 100 μm) to be adhered to the laminate body including the gas barrier layer is subjected to oxygen plasma treatment (an output power of 300 W and a treatment time of 180 sec). Thereafter, a urethane-based adhesive (Mitsui Chemicals, Inc., A-315/A-10) is coated onto the surface having undergone the oxygen plasma treatment and dried to yield a dry weight of 3 g/cm². The resultant is adhered to the laminate body including the gas barrier layer and stored for 4 days in an oven at 40° C. to cure the urethane adhesive.

<Peeling Test>

The above sample obtained after curing is cut into test pieces having a size of a length of 300 nm x and a width of 10 mm, and by using an instron-type tensile tester, the peeling strength is measured at a peeling rate of 300 mm/min by means of a T-peel test method. The value of the measured peeling strength is expressed as an average of five test pieces in a unit of (N/10 mm).

Example 1

In Example 1, a UC layer is formed on a polymer base material, and a thin $TiO_2$ film is formed on the UC layer by means of ALD. As shown in Example 1 of FIG. 3, a stretched polyethylene terephthalate (PET) film (thickness of 100 μm) is prepared as the polymer base material (base material), and one surface thereof is subjected to oxygen plasma treatment. Subsequently, an undercoating agent formulated as below is coated to form a UC layer having a dry thickness of 1 μm on the polymer base material. During the oxygen plasma treatment, $O_2$ as plasma discharge gas is supplied at 100 sccm, a power source of 13.56 MHz as a power source for exciting plasma gas is used, and plasma discharge is performed for 180 sec in an ICP mode.

For the UC layer (undercoat layer), 500 g of polyvinyl alcohol (PVA) (obtained by dissolving Poval 117 which is manufactured by KURARAY, CO., LTD. and has a degree of saponification of 98% to 99% in deioinized water to yield a solid content of 5 wt %, followed by stirring) is mixed with 100 g of colloidal silica (SNOWTEX XS manufactured by NISSAN CHEMICAL INDUSTRIES, LTD), followed by stirring. Moreover, coating of the undercoat layer is performed by bar coating. The coated sample is dried for 5 minutes in an oven at 105° C. At this time, plasma etching is not performed on the UC layer.

Thereafter, by using an ALD film formation apparatus (Opal manufactured by Oxford Instruments), a thin $TiO_2$ film having a thickness of about 10 nm is formed on the UC layer on the polymer base material by means of ALD. The Water Vapor Transmission Rate (WVTR) of the laminate body in which the thin $TiO_2$ film has been formed as above is measured. The value of WVTR measured at this time is $5.0 \times 10^{-4}$ [g/m²/day]. The peeling strength of the sample laminated under the above lamination conditions is measured according to the peeling test method described above. The peeling strength is 6.1 N/10 mm.

Example 2

As shown in Example 2 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 1 is formed on the base material. The polymer base material on which the UC layer has been formed is then loaded on the plasma asher apparatus to perform plasma etching on the surface of the UC layer. At this time, etching is performed for 30 minutes. Subsequently, a thin $TiO_2$ film having a thickness of 10 nm is formed under the same conditions as in Example 1. The Water Vapor Transmission Rate (WVTR) of the laminate body in which the thin $TiO_2$ film has been formed as above is measured. The value of WVTR measured at this time is $5.0 \times 10^{-4}$ [g/m²/day]. The peeling strength of the sample laminated under the above lamination conditions is measured according to the peeling test method described above. The peeling strength is 6.4 N/10 mm.

Example 3

As shown in Example 3 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 1 is formed on the base material. The polymer base material on which the UC layer has been formed is then loaded on the plasma asher apparatus to perform plasma etching on the surface of the UC layer. At this time, etching is performed for 30 minutes. In addition, the oxygen plasma treatment, which is performed on the surface of the polymer base material in Example 1, is performed on the surface of the UC layer having undergone the plasma etching, under the same condition. Subsequently, a thin $TiO_2$ film having a thickness of 10 nm is formed under the same conditions as in Example 1. The Water Vapor Transmission Rate (WVTR) of the laminate body in which the thin $TiO_2$ film has been formed as above is measured. The value of WVTR measured at this time is $5.0 \times 10^{-4}$ [g/m²/day]. The peeling strength of the sample laminated under the above lamination conditions is measured according to the peeling test method described above. The peeling strength is 6.5 N/10 mm.

Example 4

As shown in Example 4 of FIG. 3, a stretched PET film (thickness of 100 μm) is prepared as the polymer base material (base material), and one surface thereof is subjected to oxygen plasma treatment. Thereafter, an undercoat layer formulated as below is formed on the base material. Subsequently, a thin TiO$_2$ film having a thickness of 10 nm is formed under the same conditions as in Example 1. For the UC layer (undercoat layer), 150 g of urethane-based binder (solid content of 20%) is mixed with 100 g of organosilica sol (MEK-ST manufactured by NISSAN CHEMICAL INDUSTRIES, LTD), followed by stirring. At this time, plasma etching is not performed on the UC layer. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 7.0 N/10 mm.

Example 5

As shown in Example 5 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 4 is formed on the base material. The polymer base material on which the UC layer has been formed is then loaded on the plasma asher apparatus to perform plasma etching on the surface of the UC layer. At this time, etching is performed for 30 minutes. Subsequently, a thin TiO$_2$ film having a thickness of 10 nm is formed under the same conditions as in Example 1. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 7.5 N/10 mm.

Example 6

As shown in Example 6 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 4 is formed on the base material. The polymer base material on which the UC layer has been formed is then loaded on the plasma asher apparatus to perform plasma etching on the surface of the UC layer. At this time, etching is performed for 30 minutes. In addition, the oxygen plasma treatment, which is performed on the surface of the polymer base material in Example 1, is performed on the surface of the UC layer having undergone the plasma etching, under the same conditions. Subsequently, a thin TiO$_2$ film having a thickness of 10 nm is formed under the same conditions as in Example 1. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 7.7 N/10 mm.

Example 7

As shown in Example 7 of FIG. 3, a stretched PET film (thickness of 100 μm) is prepared as the polymer base material (base material), and one surface thereof is subjected to oxygen plasma treatment. Thereafter, an undercoat layer formulated as below is formed on the base material, and then a thin TiO$_2$ film having a thickness of 10 nm is formed under the same conditions as in Example 1. For the UC layer (undercoat layer), 500 g of polyvinyl alcohol (PVA) (obtained by dissolving Poval 117 which is manufactured by KURARAY, CO LTD. and has a degree of saponification 98% to 99% in deionized water to yield a solid content of 5 wt %, followed by stirring) is mixed with 25 g of montmorillonite (Kunipia F manufactured by KUNIMINE INDUSTRIES CO., LTD.), followed by stiffing to form a layered compound. At this time, the UC layer is subjected to plasma etching but is not subjected to the oxygen plasma treatment after the plasma etching. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 6.0 N/10 mm.

Example 8

As shown in Example 8 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 7 is formed on the base material, and then a thin TiO$_2$ film having a thickness of 10 nm is formed under the same conditions as in Example 1. At this time, the UC layer is subjected to both the plasma etching and the oxygen plasma treatment following the plasma etching. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 6.1 N/10 mm.

Example 9

As shown in Example 9 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 7 is formed on the base material. Subsequently, a thin TiO$_2$ film having a thickness of 5 nm is formed under the same conditions as in Example 1. At this time, the UC layer is subjected to plasma etching but is not subjected to the oxygen plasma treatment after the plasma etching. The Water Vapor Transmission Rate (WVTR) of the laminate body in which the thin TiO$_2$ film has been formed as above is measured. The value of WVTR measured at this time is 5.0×10$^{-4}$ [g/m$^2$/day]. The peeling strength of the sample laminated under the above lamination conditions is measured according to the peeling test method described above. The peeling strength is 6.0 N/10 mm.

Example 10

As shown in Example 10 of FIG. 3, a stretched PET film (thickness of 100 μm) is prepared as the polymer base material (base material), and one surface thereof is subjected to oxygen plasma treatment. Thereafter, an undercoat layer formulated in the same manner as in Example 7 is formed on the base material. Subsequently, a thin $TiO_2$ film having a thickness of 5 nm is formed under the same conditions as in Example 1. At this time, the UC layer is subjected to both the plasma etching and the oxygen plasma treatment following the plasma etching. The Water Vapor Transmission Rate (WVTR) of the laminate body in which the thin $TiO_2$ film has been formed as above is measured. The value of WVTR measured at this time is $5.0 \times 10^{-4}$ [$g/m^2/day$]. The peeling strength of the sample laminated under the above lamination conditions is measured according to the peeling test method described above. The peeling strength is 6.1 N/10 mm.

COMPARATIVE EXAMPLES

Next, in order to demonstrate the superiority in the water vapor transmission rate of the laminate body including the gas barrier layer according to the present example, the laminate body will be compared with comparative examples shown in FIG. 3.

Comparative Example 1

As shown in Comparative Example 1 of FIG. 3, a stretched PET film (thickness of 100 pin) is prepared as a polymer base material (base material). After the oxygen plasma treatment is performed on one surface of the base material, a thin $TiO_2$ film having a thickness of 10 nm is formed under the same conditions as in Example 1, without performing the undercoating treatment. Subsequently, the Water Vapor Transmission Rate (WVTR) of the sample in which the thin $TiO_2$ film has been formed is measured. The value of WVTR measured at this time is $5.2 \times 10^{-3}$ [$g/m^2/day$]. That is, when the thin $TiO_2$ film is formed by means of ALD in a state where the UC layer has not been formed on the polymer base material, the WVTR deteriorats by a degree of about one digit. The peeling strength of the sample laminated under the above lamination conditions is measured according to the peeling test method described above. The peeling strength is 5.0 N/10 mm.

Comparative Example 2

As shown in Comparative Example 2 of FIG. 3, a stretched PET film (thickness of 100 pin) is prepared as a polymer base material (base material). After the oxygen plasma treatment is performed on one surface of the base material, a thin $TiO_2$ film having a thickness of 20 nm is formed under the same conditions as in Example 1, without performing the undercoating treatment. Subsequently, the Water Vapor Transmission Rate (WVTR) of the sample in which the thin $TiO_2$ film has been formed is measured. The value of WVTR measured at this time is $5.3 \times 10^{-3}$ [$g/m^2/day$]. That is, when the thin $TiO_2$ film is formed by means of ALD in a state where the UC layer has not been formed on the polymer base material, the WVTR deteriorates by a degree of about one digit, even if the film thickness of the ALD layer is increased. The peeling strength of the sample laminated under the above lamination conditions is measured according to the peeling test method described above. The peeling strength is 5.1 N/10 mm.

Comparative Example 3

As shown in Comparative Example 3 of FIG. 3, a stretched PET film (thickness of 100 μm) is prepared as a polymer base material (base material). After the oxygen plasma treatment is performed on one surface of the base material, and a 5% polyvinyl alcohol (PVA) solution (a solution obtained by dissolving Poval 117 which is manufactured by KURARAY, CO., LTD. and has a degree of saponification 98% to 99% in deioinized water to yield a solid content of 5 wt %) is dissolved by stirring and coated as a UC layer. At this time, coating is performed by bar coating. The sample having undergone coating is dried for 5 minutes in an oven at 105° C., and then a thin $TiO_2$ film having a thickness of 10 nm is formed under the same conditions as in Example 1. That is, the UC layer of the laminate body of Comparative Example 3 consists of only PVA and does not include a layered compound.

Finally, the Water Vapor Transmission Rate (WVTR) of the sample of the laminate body in which the thin $TiO_2$ film has been formed is measured. The value is measured to be $3.8 \times 10^{-3}$ [$g/m^2/day$]. That is, the WVTR is slightly improved compared to the case where the UC layer is not provided as in Comparative Example 1. However, the WVTR deteriorated by about a degree of one digit, compared to the case where the undercoat layer (UC layer) having the layered compound of the inorganic substance is provided as in the present example. The peeling strength of the sample laminated under the above lamination conditions is measured according to the peeling test method described above. The peeling strength is 5.8 N/10 mm.

<<Summary>>

As described above, according to the laminate body of the present invention, if the ALD film is formed on the polymer base material after the undercoat layer including the inorganic substance is formed on the substrate, a dense ALD film can be formed on the polymer base material. By forming such a dense ALD film, the gas barrier properties can be improved, and the polymer base material can have excellent insulating properties. Moreover, since a dense ALD film grows on the polymer base material, a desired performance can be realized in the polymer base material even if the thickness of the ALD film is small. In addition, since the adhesive strength of the atomic layer deposition film with respect to the undercoat layer and the base material is also improved, when the laminate body is laminated, a laminated product having a high peeling strength is obtained.

Second Embodiment

Next, the second embodiment of the present invention will be described. In the present embodiment, the same constituents as those described in the first embodiment are marked with the same reference signs, and the description thereof will not be repeated.

The laminate body according to the present embodiment has an undercoat layer between a base material and an atomic layer deposition film. The undercoat layer is a layer including an organic polymer, and the organic polymer has binding sites binding to precursors of the atomic layer deposition film. That is, the organic polymer included in the undercoat layer has a large number of functional groups as binding sites that easily bind to the precursors of the atomic layer deposition film. Accordingly, the precursors having bound to the respective functional groups of the organic polymer bind to one another. Therefore, a two-dimensional atomic layer deposition film growing in the surface direction of the undercoat layer is formed. As a result, a space that allows gas to permeate in the film thickness direction of the laminate body is not easily formed, whereby the laminate body having a high degree of gas barrier properties can be realized. Moreover, in the undercoat layer, an inorganic substance may disperse. That is, if the inorganic substance is added to the undercoat layer, the adsorption density of precursors of the atomic layer deposition film can be further improved.

In the present embodiment, in order to realize (1) improvement of the density of adsorption sites of precursors and (2) prevention of diffusion of precursors to the polymer base material, an undercoat layer including an organic polymer is disposed on the polymer base material. That is, in order to two-dimensionally dispose adsorption sites of the precursors on the surface of the polymer base material at a high density, prior to the ALD process, an undercoat layer including an organic polymer is disposed on the polymer base material. Moreover, in order to improve the density of the adsorption sites of the precursors, an inorganic substance is added to the undercoat layer. If an undercoat layer including an organic polymer is disposed on the polymer substrate in this manner, the gas including the precursors is not easily transmitted through the undercoat layer.

<Structure of Laminate Body>

Figure 4:
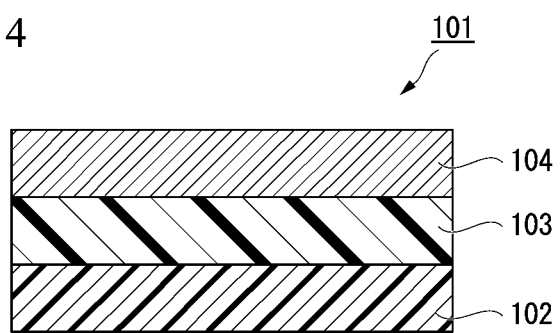
FIG. 4 is a cross-sectional view showing the structure of a laminate body according to the second embodiment of the present invention.

As shown in FIG. 4, a laminate body 101 of the present embodiment includes a UC layer 103 including an organic polymer material, instead of the UC layer 3 described above in the first embodiment. The organic polymer included in the UC layer 103 secures the adsorption sites of the precursors of the ALD film 4. That is, the organic polymer included in the UC layer 103 has functional groups onto which the precursors of the ALD film 4 are easily adsorbed. Accordingly, when the precursors of the ALD film 4 bind to the functional groups of the organic polymer included in the UC layer 103, the ALD film 4 is formed into a membrane shape to cover the UC layer 103.

In order to secure the adsorption sites on the base material 2 by using the organic polymer included in the UC layer 103, it is necessary to select an organic polymer having functional groups onto which the precursors of the ALD film 4 are easily adsorbed. Further, an organic polymer in which the density of the functional groups is high is selected. Moreover, if surface treatment such as plasma treatment or hydrolytic treatment is performed on the base material 1, the surface of the organic polymer is modified, and the density of the functional groups of the organic polymer is increased. It is also possible to further increase the adsorption density of the precursors by adding an inorganic compound to the organic polymer.

Figure 5A:
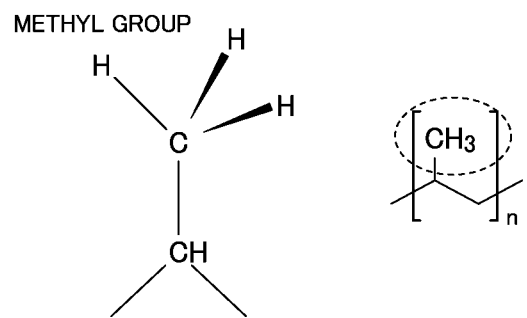
FIG. 5A is a view showing the chemical formula of a functional group, which is a methyl group, of an organic polymer.
Figure 5B:
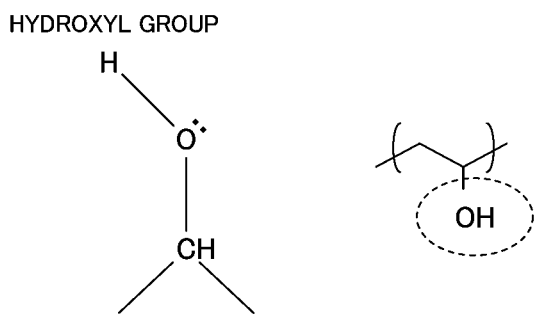
FIG. 5B is a view showing the chemical formula of a functional group, which is a hydroxyl group, of the organic polymer.
Figure 5C:
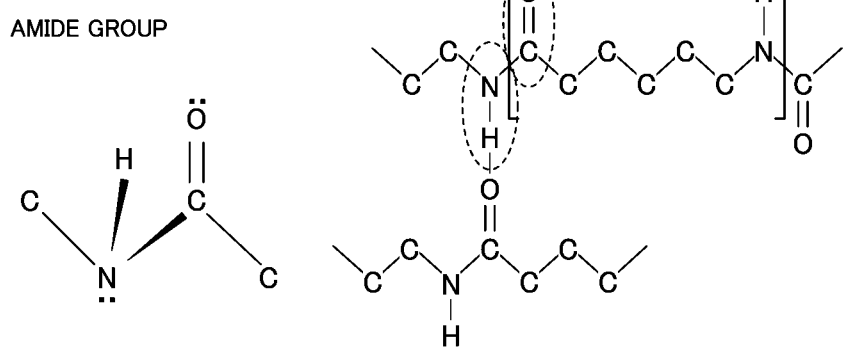
FIG. 5C is a view showing the chemical formula of a functional group, which is an amide group, of the organic polymer.

Herein, the organic polymer having functional groups onto which the precursors of the ALD film 4 are easily adsorbed will be described. FIGS. 5A, 5B, and 5C are views showing chemical formulae of functional groups of the organic polymer. FIG. 5A shows a methyl group, FIG. 5B shows a hydroxyl group, and FIG. 5C shows an amide group.

When PP having methyl groups shown in FIG. 5A as functional groups is used as the material of the organic polymer of the UC layer 103, the ALD film 4 is formed and grows slowly at the initial stage (that is, the adsorption speed of the precursors is slow). In other words, when PP is used as the material of the organic polymer of the UC layer 103, since the functional groups thereof are methyl groups, the precursors are not easily adsorbed onto the functional groups. Accordingly, PP is not preferable as the material of the organic polymer used for the UC layer 103.

When PVA having hydroxyl groups shown in FIG. 5B as functional groups is used as the material of the organic polymer of the UC layer 103, the ALD film 4 is formed and grows rapidly at the initial stage (that is, the adsorption speed of the precursors is high). In other words, when PVA is used as the material of the organic polymer of the UC layer 103, since the functional groups thereof are hydroxyl groups, the precursors are easily adsorbed onto the functional groups. Accordingly, PVA can be used as the material of the organic polymer used for the UC layer 103.

When nylon-6 having amide groups shown in FIG. 5C as functional groups is used as the material of the organic polymer of the UC layer 103, the ALD film 4 is formed and grows rapidly at the initial stage (that is, the adsorption speed of the precursors is high). In other words, when nylon-6 is used as the material of the organic polymer of the UC layer 103, since the functional groups thereof are amide groups, the precursors are extremely easily adsorbed onto the functional groups. Accordingly, nylon-6 is desirable as the material of the organic polymer used for the UC layer 103.

That is, it is not desirable to use PP or the like having methyl groups, onto which the precursors are not easily adsorbed, for the UC layer 103. Therefore, for the UC layer 103, it is desirable to use PVA having hydroxyl groups onto which the precursors are relatively easily adsorbed, and it is more desirable to use nylon-6 having amide groups onto which the precursors are extremely easily adsorbed. In other words, the polarity of the functional groups or the presence or absence of electron-donating atoms is a key point of the adsorption speed of the precursors. That is, the polarity of the functional groups and the presence or absence of the electron-donating atoms is a key point for selecting the organic polymer used for the UC layer 103.

That is, when PP having functional groups (methyl groups) onto which the precursors of the ALD film are not easily adsorbed is used for the UC layer 103, since the adsorptivity of the precursors of the ALD film to PP is low, the density of the ALD film in the boundary between PP and the polymer decreases, whereby the gas barrier properties deteriorate. On the other hand, if nylon-6 having functional groups (amide groups) onto which the precursors of the ALD film are easily adsorbed is used for the UC layer 103, since the adsorptivity of the precursors of the ALD film to the nylon-6 is high, the density of the ALD film in the boundary between nylon-6 and the polymer increases, whereby the gas barrier properties are improved.

Moreover, since the density of the adsorption sites increases, adhesiveness of the atomic layer deposition layer with respect to the undercoat and the base material is improved.

The materials of the organic polymer having functional groups onto which the precursors of the ALD film are easily adsorbed also include, in addition to the above materials, a urethane resin having isocyanate groups, a polyimide resin having imide groups, polyester sulfone (PES) having sulfone groups, polyethylene terephthalate (PET) having ester groups, and the like.

Figure 6:
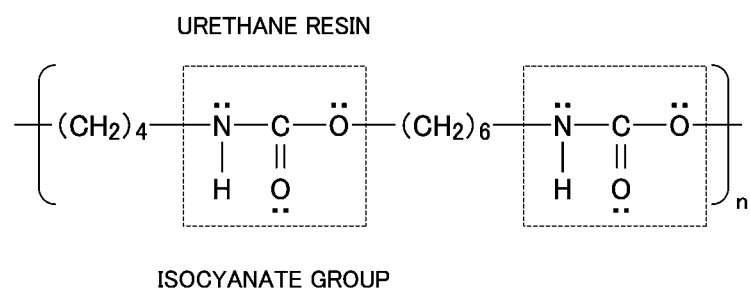
FIG. 6 is a view showing the chemical formula of an isocyanate group as a functional group of a urethane resin.
Figure 7:
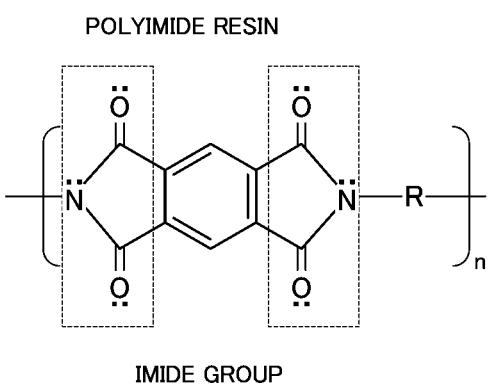
FIG. 7 is a view showing the chemical formula of an imide group as a functional group of a polyimide resin.
Figure 8:
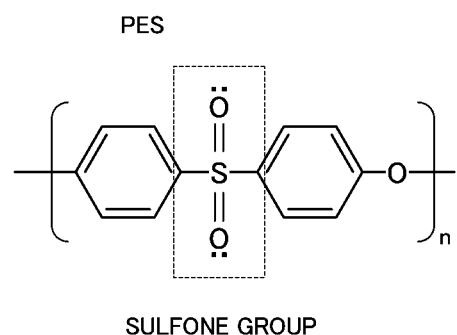
FIG. 8 is a view showing the chemical formula of a sulfone group as a functional group of PES.
Figure 9:
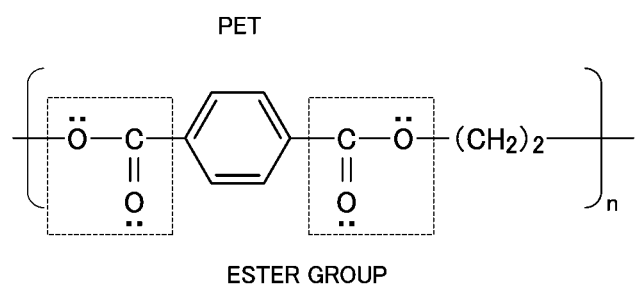
FIG. 9 is a view showing the chemical formula of an ester group as a functional group of PET.

FIG. 6 is a view showing the chemical formula of an isocyanate group as a functional group of a urethane resin. FIG. 7 is a view showing the chemical formula of an imide group as a functional group of a polyimide resin. FIG. 8 is a view showing the chemical formula of a sulfone group as a functional group of PES. FIG. 9 is a view showing the chemical formula of an ester group as a functional group of PET.

That is, it is desirable for the functional groups of the organic polymer included in the UC layer 103 to have an O atom or an N atom. The functional groups having an O atom include OH groups, COOH groups, COOR groups, COR groups, NCO groups, $SO_3$ groups, and the like. Moreover, the functional groups having an N atom include $NH_X$ groups (X is an integer). In addition to the above, it is preferable for the functional groups of the organic polymer included in the UC layer 103 to be functional groups which include atoms having unshared electron pairs or unpaired electrons (dangling bonds) and have interaction with the precursors, such as coordinate bonds, bonds formed by intermolecular force (van der Waals force), and hydrogen bonds.

Figure 10:
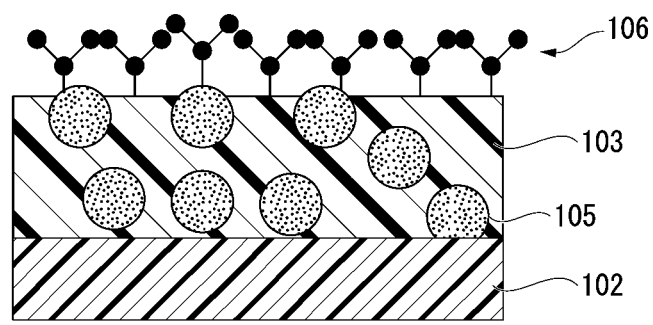
FIG. 10 is a schematic view showing a precursor binding state that is observed when an inorganic compound is added to an undercoat layer.

FIG. 10 is a schematic view showing a precursor binding state that is observed when an inorganic compound is added to an undercoat layer 103. That is, as shown in FIG. 10, when an inorganic compound 5 is added to the UC layer 103 of the organic polymer onto which the precursors of the ALD film are easily adsorbed, a precursor 6 binds to the functional group of the organic polymer of the UC layer 103 and to the inorganic compound 5 having been added to the UC layer 103. As a result, the adsorption density of the precursors 6 is further improved, whereby the gas barrier properties can be further enhanced.

<Manufacturing Process of Laminate Body>

Figure 11:
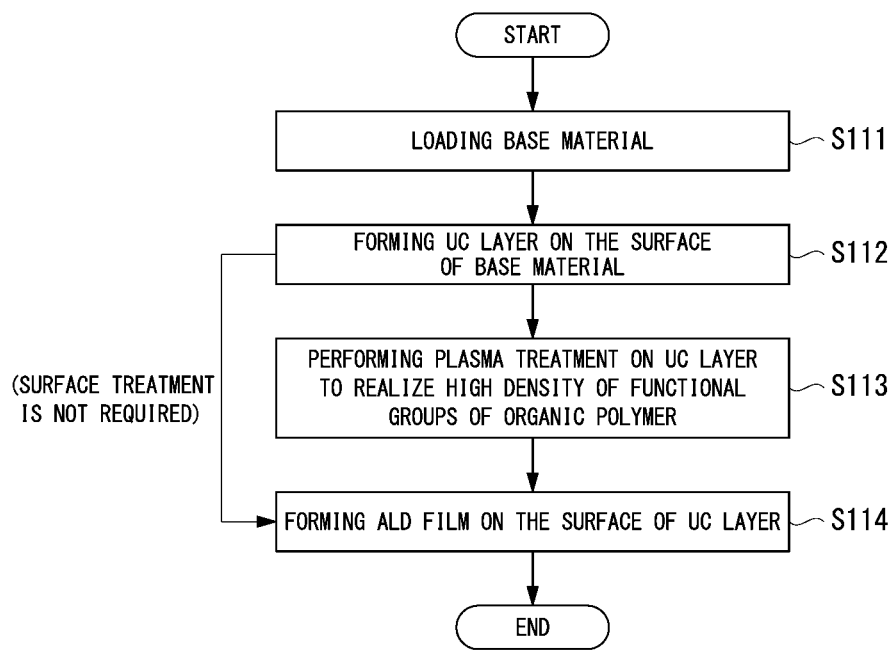
FIG. 11 is a flowchart illustrating a summary of a manufacturing process of the laminate body shown in FIG. 4.

FIG. 11 is a flowchart illustrating a summary of a manufacturing process of the laminate body 101 shown in FIG. 4. In FIG. 11, first, a polymeric base material 2 is loaded on a thin film formation apparatus (a semiconductor manufacturing apparatus or the like) (Step S111). Then the membrane-like or film-like UC layer 103 including an organic polymer is formed on the surface of the base material 2 having been loaded on the thin film formation apparatus (Step S112).

Thereafter, surface treatment is performed on the surface (that is, the surface opposite to the surface coming into contact with the base material 2) of the UC layer 103 having been formed by the Step S12 to increase the density of the functional groups of the organic polymer included in the UC layer 103 (Step S113). Subsequently, the ALD film 4 is formed on the surface of the UC layer 103 such that the precursors of the ALD film 4 bind to the functional groups, of which the density has been increased by Step S13, of the organic polymer (Step S114). In the Step S113, the surface of the UC layer 103 can be optionally treated by plasma etching or hydrolytic treatment to increase the density of the functional groups of the organic polymer.

In this way, by the above Steps S111 to S114, a dense ALD film 4 can be formed on the surface of the UC layer 103. Accordingly, the gas barrier properties of the laminate body 101 can be improved. Particularly, by increasing the density of the functional groups of the organic polymer by means of performing surface treatment on the UC layer 103, the gas barrier properties of the laminate body 101 can be further improved.

Figure 12:
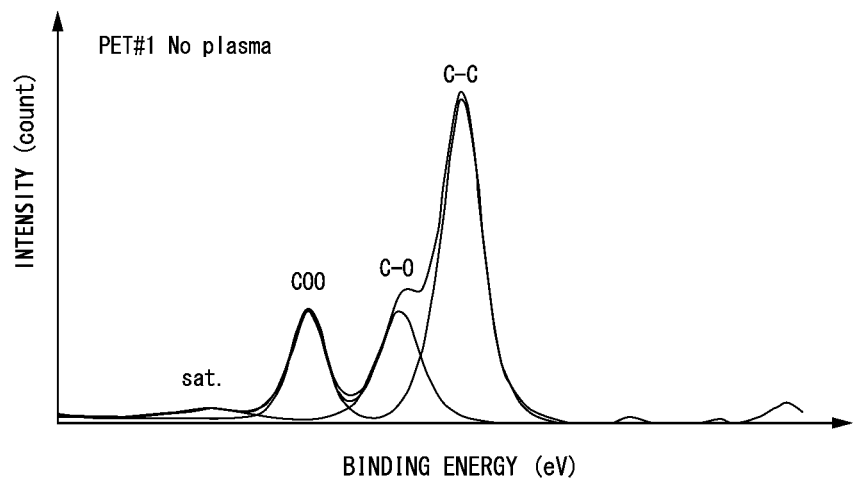
FIG. 12 shows surface properties, which are obtained by X-ray photoelectron spectroscopy, of a PET base material having not undergone plasma treatment.
Figure 13:
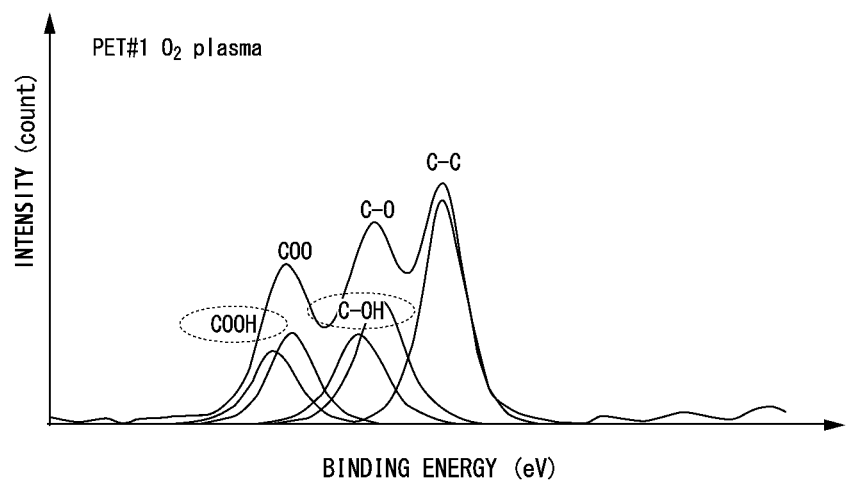
FIG. 13 shows the surface properties, which are obtained by X-ray photoelectron spectroscopy, of a PET base material having undergone plasma treatment.

Herein, the effect obtained when the surface treatment is performed on the UC layer 103 by means of plasma etching will be described in detail. FIG. 12 shows surface properties, which are obtained by X-ray photoelectron spectroscopy, of a PET base material having not undergone plasma treatment. Moreover, FIG. 13 shows the surface properties, which are obtained by X-ray photoelectron spectroscopy, of a PET base material having undergone plasma treatment. In both the FIGS. 12 and 13, the abscissa shows binding energy (eV), and the ordinate shows intensity (count) corresponding to the binding energy of the functional groups. That is, FIG. 12 is a view showing the properties, which are observed when plasma treatment is not performed on "PET #1 (polyethylene terephthalate-including resin)" as an organic polymer, of the functional groups on the surface layer. In addition, FIG. 13 is a view showing the properties, which are observed when $O_2$ plasma treatment is performed on the "PET #1" as an organic polymer, of the functional groups on the surface layer.

When the plasma treatment is not performed on the "PET #1", as shown in FIG. 12, functional groups such as C—C groups, C—O groups, and COO groups appear in the surface layer. On the other hand, when the $O_2$ plasma treatment is performed on the "PET #1", in addition to the functional groups such as C—C groups, C—O groups, and COO groups, functional groups such as C—O groups and COOH groups appear in the surface layer, as shown in FIG. 13.

That is, if the plasma treatment is performed on the PET base material, the polymer surface is modified, and C—OH groups or COOH groups which do not appear before the plasma treatment appear, whereby the density of the functional groups is improved. As a result, since the precursors of the ALD film bind to the functional groups of the PET base material at a higher density, the gas barrier properties of the laminate body are further improved. In other words, since the density of the functional groups is increased, the density of the adsorption sites to which the precursors of the ALD film can bind increases. Accordingly, the ALD film grows two-dimensionally, whereby a dense film structure having a high degree of gas barrier properties can be obtained.

Figure 14:
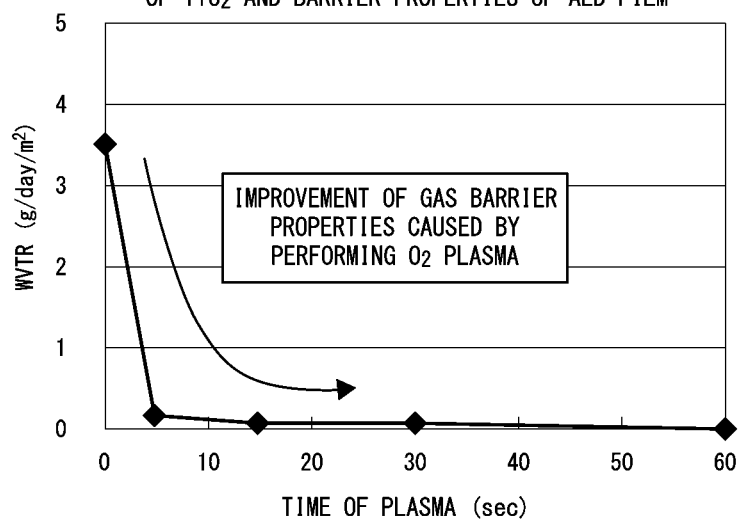
FIG. 14 is a characteristic diagram showing the relationship between pretreatment conditions of $TiO_2$ and gas barrier properties of an ALD film.

FIG. 14 is a characteristic diagram showing the relationship between pretreatment conditions of $TiO_2$ and gas barrier properties of an ALD film. The abscissa shows a plasma time [sec], and the ordinate shows a Water Vapor Transmission Rate (WVTR) [g/day/m$^2$]. As shown in FIG. 14, when the film having the WVTR of 3.5 [g/day/m$^2$] when not being subjected to the $O_2$ plasma treatment is treated with $O_2$ plasma, the WVTR thereof rapidly increases. That is, when the $O_2$ plasma treatment is performed for about 10 sec or longer, the WVTR virtually stays zero. By performing the $O_2$ plasma treatment in this way, the gas barrier properties can be further improved. Moreover, with the plasma treatment using $N_2$, $CO_2$, $O_3$, or the like as plasma gas, the gas barrier properties can also be improved.

<Organic Polymer Used for UC Layer>

Next, the organic polymers used for the UC layer 103 will be described. The organic polymers used for the UC layer 103 are classified into aqueous organic polymers and solvent-based organic polymers depending on the type of a solvent to be used. Examples of the aqueous organic polymers include polyvinyl alcohol, polyethylenimine, and the like. Examples of the solvent-based organic polymers include acrylic ester, urethane acryl, polyester acryl, polyether acryl, and the like.

Next, more specific examples of the organic polymers used for the UC layer 103 will be descried.

1. Organic Polymer of O Atom-including Resin

The following materials are preferable as the organic polymer of an O atom-including resin. As hydroxyl group (OH) group-including resins, there are polyvinyl alcohol, phenol resins, polysaccharide, and the like. The polysaccharide includes cellulose, cellulose derivatives such as hydroxymethyl cellulose, hydroxyethyl cellulose, and carboxymethyl cellulose, chitin, chitosan, and the like. Moreover, as carbonyl group (COOH)-including resins, a carboxyvinyl polymer and the like are also preferable materials.

The organic polymer of an O atom-including resin other than the above includes polyketone, polyether ketone, polyether ether ketone, aliphatic ketone, and the like of a ketone group (CO)-including resin. In addition, a polyester resin, a polycarbonate resin, a liquid crystal polymer, polyethylene terephthalate (PET), polybutylene terephthalate (PBT), polyethylene naphthalate (PEN), polybutylene naphthalate (PBN), polytrimethylene terephthalate (PTT), and the like of an ester group (COO)-including resin can also be used. Moreover, an epoxy-based resin, an acrylic resin, and the like including the above functional groups may be used.

2. Organic Polymer of N Atom-including Resin

The following materials are preferable as the organic polymer of an N atom-including resin. The materials include polyimide, polyetherimide, polyamideimide, alicyclic polyimide, solvent-soluble polyimide, and the like of an imide group (CONHCO)-including resin. Regarding the alicyclic polyimide, though aromatic polyimide is generally obtained from an aromatic tetracarboxylic acid anhydride and an aromatic diamine, this type of polyimide does not have transparency. Therefore, in order to obtain transparent polyimide, an acid dianhydride or a diamine can be substituted with an aliphatic or alicyclic group. Alicyclic carboxylic acid includes 1,2,4,5-cyclohexane tetracarboxylic acid, 1,2,4,5-cyclopentane tetracarboxylic dianhydride, and the like. Further, the solvent-soluble polyimide includes γ-butyrolactone, N,N-dimethylacetamide, N-methyl-2-pyrrolidone, and the like.

Preferable materials of the organic polymer of an N atom-including resin include nylon-6, nylon-6,6, a meta-xylene diamine-adipic acid polycondensate, polymethyl methacrylimide, and the like of an amide group (NHCO)-including resin. The materials also include a urethane resin of an isocyanate group (NHCOO)-including resin and the like. The urethane resin can also be used as an adhesive layer. In addition, an amino group (NH)-including resin can also be used.

3. Organic Polymer of S Atom-including Resin

The following materials can be used as the organic polymer of an S atom-including resin. That is, the materials include polyether sulfone (PES), polysulfone (PSF), polyphenyl sulfone (PPS), and the like of a sulfonyl group ($SO_2$)-including resin. Among these, PES and PSF are materials having a high degree of heat resistance. Moreover, a polymer alloy, a polybutylene terephthalate-based polymer alloy, polyphenylene sulfide-based polymer alloy, and the like can be used as the organic polymer. The polymer alloy may optionally make the above polymers into a polymer complex (alloy, blend, or composite).

<Additional Note>

As described above, if the inorganic substance (inorganic compound) is added to the UC layer 103, the adsorption density of the precursors of the ALD film is further improved. Therefore, the inorganic substance added to the UC layer will be described in detail. The inorganic substance to be added to the UC layer includes a metal alkoxide (a precursor of the inorganic compound) which is represented by General formula R1(M-OR2). Here, R1 and R2 are organic groups having 1 to 8 carbon atoms, and M is a metal atom. Moreover, the metal atom M includes Si, Ti, Al, Zr, and the like.

Examples of compounds which include Si as the metal atom M and are represented by R1(Si—OR2) include tetramethoxysilane, tetraethoxysilane, tetrapropoxysilane, tetrabutoxysilane, methyltrimethoxysilane, methyltriethoxysilane, dimethyldimethoxysilane, dimethyldiethoxysilane, and the like.

Examples of compounds which include Zr as the metal atom M and are represented by R1(Zr—OR2) include tetramethoxyzirconium, tetraethoxyzirconium, tetraisopropoxyzirconium, tetrabutoxyzirconium, and the like.

Examples of compounds which include Ti as the metal atom M and are represented by R1(Ti—OR2) include tetramethoxytitanium, tetraethoxytitanium, tetraisopropoxytitanium, tetrabutoxytitanium, and the like.

Examples of compounds which include Al as the metal atom M and are represented by R1(Al—OR2) include tetramethoxyaluminum, tetraethoxyaluminum, tetraisopropoxyaluminum, tetrabutoxyaluminum, and the like.

EXAMPLES

Next, specific examples of the laminate body which is realized based on the above embodiment and has a gas barrier layer formed of an atomic layer deposition film will be described.

<Method for Forming Gas Barrier Layer>

1. Formation of $Al_2O_3$ Film

On the upper surface a UC layer disposed on a polymer substrate, an $Al_2O_3$ film is formed by Atomic Layer Deposition (ALD). At this time, Trimethyl Aluminum (TMA) is used as raw material gas. $O_2$ and $N_2$ as process gas are supplied into a film formation chamber simultaneously with the raw material gas. In addition, $O_2$ and $N_2$ as purge gas and $O_2$ as plasma process gas and also as reactant gas are supplied into the film formation chamber. A treatment pressure at this time is controlled to be 10 Pa to 50 Pa. Moreover, as a power source for exciting plasma gas, a power source of 13.56 MHz is used, and plasma discharge is performed in an Inductively Couple Plasma (ICP) mode.

TMA and the process gas are supplied for 60 msec, the purge gas is supplied for 10 sec, and $O_2$ as the plasma process gas and also as the reactant gas is supplied for 5 sec. Further, while $O_2$ as the plasma process gas and also as the reactant gas is being supplied, plasma discharge is caused in an ICP mode. At this time, the output power of plasma discharge is controlled to be 250 W. Moreover, in order to perform gas purging after the plasma discharge, $O_2$ and $N_2$ as purge gas are supplied for 10 sec. The film formation temperature at this time is controlled to be 90° C.

The $Al_2O_3$ film formation speed under the above cycle conditions is as follows. That is, since a unit film formation speed is 1.4 Å/cycle to 1.5 Å/cycle, when a film having a thickness of 10 nm is formed by performing 70 cycles of film formation treatment, about 30 minutes is taken in total for forming the film.

<Water Vapor Transmission Rate of Gas Barrier Layer>

Next, regarding experimental results of the water vapor transmission rate of the laminate body which is realized based on the above embodiment and includes the gas barrier layer, some examples will be described. These experimental results of the respective examples are in regard to the gas barrier properties of the laminate body realized by the above embodiment and are obtained by measuring a water vapor transmission rate in an atmosphere of 40° C./90% RH by using a water vapor transmission analyzer (MOCON Aquatran (registered trademark) manufactured by Modern Controls, Inc.). FIG. 15 is a view comparing a laminate body with a gas barrier layer of the present example with a laminate body without a gas barrier layer of a comparative example in terms of a water vapor transmission rate. Accordingly, the superiority of the respective examples will be described with reference to FIG. 15.

<Lamination>

The laminate body which is realized based on the above embodiment and has the gas barrier layer is laminated on another stretched polyethylene terephthalate (PET) film by using an adhesive, and a peeling strength of the resultant obtained by lamination is measured. Prior to the lamination, the stretched polyethylene terephthalate (PET) film (thickness of 100μ) to be adhered to the laminate body including the gas barrier layer is subjected to oxygen plasma treatment (an output power of 300 W and a treatment time of 180 sec). Thereafter, a urethane-based adhesive (Mitsui Chemicals, Inc., A-315/A-10) is coated onto the surface having undergone the oxygen plasma treatment and dried to yield a dry weight of 3 g/cm². The resultant is adhered to the laminate body including the gas barrier layer and stored for 4 days in an oven at 40° C. to cure the urethane adhesive.

<Peeling Test>

The above sample obtained after curing is cut into test pieces having a size of a length of 300 nm x and a width of 10 mm, and by using an instron-type tensile tester, the peeling strength is measured at a peeling rate of 300 mm/min by means of a T-peel test method. The value of the measured peeling strength is expressed as an average of five test pieces in a unit of (N/10 mm).

Example 1

In Example 1, the UC layer is formed on the polymer base material and a thin $Al_2O_3$ film is formed on the UC layer by means of ALD. That is, as shown in Example 1 of FIG. 15, a polyethylene terephthalate (PET) film of which one surface has undergone easy-adhesion treatment and the other surface has not been treated (hereinafter, called a plain surface) and which has a thickness of 100 μm is used as a base material, and oxygen plasma treatment is (an output power of 300 W and a treatment time of 180 sec) is performed on the plain surface.

Thereafter, the PET surface having undergone the oxygen plasma treatment is coated with polyvinyl alcohol (PVA) as a material of the undercoat layer by a wire bar, the resultant is dried at 105° C./5 min, whereby the undercoat layer (UC layer) of PVA having a thickness of 1 μm is provided. Subsequently, an $Al_2O_3$ film of about 10 nm is formed on the UC layer by means of ALD. At this time, the plasma treatment is not performed on the UC layer. The Water Vapor Transmission Rate (WVTR) of the sample of the laminate body in which the thin $Al_2O_3$ film has been formed in this manner is measured.

The value of the WVTR measured at this time is $5.3 \times 10^{-3}$ [g/m²/day]. The peeling strength of the sample laminated under the above lamination conditions is measured according to the peeling test method described above. The peeling strength is 5.8 N/10 mm.

Example 2

As shown in Example 2 of FIG. 15, a stretched PET film (thickness of 100 μm) is prepared as a polymer base material (base material), and 150 g of a urethane-based binder (a solid content of 20%) is mixed with 100 g of organosilica sol (MEK-ST manufactured by NISSAN CHEMICAL INDUSTRIES, LTD), followed by stirring, thereby obtaining an undercoat material of polyester urethane. Moreover, the undercoat material of polyester urethane is coated using a wire bar onto the PET film having undergone the plasma treatment in the same manner as in Example 1, followed by drying for 1 minute at 100° C., thereby forming a urethane-based undercoat layer having a thickness of 1 μm.

Then an $Al_2O_3$ film of 10 nm is formed on the undercoat layer by means of ALD. At this time, plasma treatment is not performed on the UC layer. The WVTR of the sample of the laminate body in which the thin $Al_2O_3$ film has been formed in this manner is measured. The value of the WVTR measured at this time is $8.7 \times 10^{-4}$ [g/m²/day]. The peeling strength of the sample laminated under the above lamination conditions is measured according to the peeling test method described above. The peeling strength is 6.8 N/10 mm.

Example 3

As shown in Example 3 of FIG. 15, an aromatic polyamide (ARAMID) film (mictron; TORAY) having a thickness of 100 μm is used as a base material, and oxygen plasma treatment (an output power of 300 W and a treatment time of 180 sec) is performed on the plain surface thereof. Thereafter, polyimide varnish is coated onto the heat-resistant PET surface having undergone the oxygen plasma treatment by using a wire bar, followed by drying for 30 minutes at 200° C., thereby forming an undercoat layer of a polyimide (PI) resin having a thickness of 1 μm. Subsequently, an $Al_2O_3$ film of 10 nm is formed on the undercoat layer by means of ALD. At this time, plasma treatment is not performed on the UC layer. The WVTR of the sample of the laminate body in which the thin $Al_2O_3$ film has been formed in this manner is measured. The value of the WVTR measured at this time is $1.0 \times 10^{-3}$ [g/m²/day]. The peeling strength of the sample laminated under the above lamination conditions is measured according to the peeling test method described above. The peeling strength is 6.5 N/10 mm.

Example 4

As shown in Example 4 of FIG. 15, a PET film having a thickness of 100 μm is used as a base material, and oxygen plasma treatment (an output power of 300 W and a treatment time of 180 sec) is performed on the plain surface thereof. Thereafter, an $Al_2O_3$ film of about 10 nm is formed on the PET surface having undergone the plasma treatment by means of ALD. The WVTR of the sample of the laminate body in which the thin $Al_2O_3$ film has been formed in this manner is measured. The value of the WVTR measured at this time is $2.1 \times 10^{-3}$ [g/m²/day]. The peeling strength of the sample laminated under the above lamination conditions is measured according to the peeling test method described above. The peeling strength is 5.0 N/10 mm.

COMPARATIVE EXAMPLES

Next, in order to demonstrate the superiority in the water vapor transmission rate of the laminate body including the gas barrier layer according to the present example, the laminate body is compared with the comparative example shown in FIG. 15.

Comparative Example 1

As shown in Comparative Example 1 of FIG. 15, a stretched PET film (thickness of 100 μm) is prepared as a polymer base material (base material). Then an $Al_2O_3$ film of about 10 nm is formed on the plain surface of the base material by means of ALD. The WVTR of the sample of the laminate body in which the thin $Al_2O_3$ film has been formed in this manner is measured. The value of the WVTR measured at this time is $7.3 \times 10^{-3}$ [g/m²/day]. The peeling strength of the sample laminated under the above lamination conditions is measured according to the peeling test method described above. The peeling strength is 4.0 N/10 mm.

Comparative Example 2

As shown in Comparative Example 2 of FIG. 15, a stretched PET film (thickness of 100 μm) is prepared as a polymer base material (base material). Thereafter, oxygen plasma treatment (an output power of 300 W and a treatment time of 180 sec) is performed on the plain surface of the PET film, and polypropylene (PP) is coated onto the surface having undergone the oxygen plasma treatment, followed by drying, thereby forming an undercoat layer of 1 µm. Subsequently, an $Al_2O_3$ film of about 10 nm is formed by means of ALD. The WVTR of the sample of the laminate body in which the thin $Al_2O_3$ film has been formed in this manner is measured. The value of the WVTR measured at this time is $3.6 \times 10^{-1}$ [$g/m^2/day$]. The peeling strength of the sample laminated under the above lamination conditions is measured according to the peeling test method described above. The peeling strength is 2.1 N/10 mm.

That is, as seen in Examples 1 to 4, if the organic polymer material having functional groups to which the precursors easily bind is provided as the undercoat layer, the gas barrier properties are further improved in any of the laminate bodies, compared to a case of the Comparative Example 1 not provided with the undercoat layer. Moreover, when PP having functional groups to which the precursors do not easily bind is provided as the undercoat layer as in Comparative Example 2, the gas barrier properties deteriorate compared to Examples 1 to 4.

<<Summary>>

As described above, according to the laminate body of the present invention, an undercoat layer (UC layer) including an organic polymer is formed on a polymer base material, and then an Atomic Layer Deposition film (ALD film) is formed, whereby a dense ALD film can be formed on the polymer base material. By the formation of the dense ALD film in this manner, the gas barrier properties can be improved, and excellent insulating properties of the polymer base material can be obtained. In addition, since the dense ALD film grows on the polymer base material, the polymer base material can realize a desired performance even if the thickness of the ALD film is small. Moreover, since the adhesive strength of the atomic layer deposition film with respect to the undercoat layer or the base material is improved, by lamination, a laminated product having a high degree of peeling strength is obtained.

It is known that an oligomer is precipitated by heating from polyethylene terephthalate (PET), which is being widely used as a base material of a barrier film. The oligomer is precipitated onto the surface of the PET base material, as a particle-like substance formed of a component such as a cyclic ethylene terephthalate trimer. When the oligomer is precipitated due to excess heat caused in the process of barrier film formation during atomic layer deposition, particles which have a small number of adsorption sites and have not undergone plasma treatment partially cover the substrate base material. In view of atomic layer deposition, this causes the decrease in density of short adsorption sites and hinders two-dimensional growth, even if the amount of the particles is small. However, if an appropriate undercoat layer is provided onto the PET surface, the precipitation of the oligomer can be reduced, the density of the adsorption sites can be maintained at a high level, and as a result, an ALD layer having a high degree of barrier properties can be formed.

So far, the embodiments of the laminate body according to the present invention have been described in detail with reference to drawings. However, the specific structure of the present invention is not limited to the contents of the embodiments described above, and if modification and the like are made to the design within a range that does not depart from the gist of the present invention, they are also included in the present invention. In the above embodiments, the method of manufacturing a laminate body and a laminate body manufacturing apparatus were described. However, needless to say, the present invention is not limited thereto and can be applied to a of manufacturing method or a manufacturing apparatus of a gas barrier film obtained by forming the laminate body which is realized by the present invention into a film shape.

The laminate body of the present invention of course can be used for electronic parts such as an electroluminescence device (EL device), a liquid crystal display, and a semiconductor wafer. Moreover, the laminate body can be effectively used for packing films of pharmaceutical products, foods, or the like, packing films of precision parts, and the like.

The invention claimed is:

1. A laminate body, comprising:
a base material;
a membrane-like or film-like undercoat layer that is formed on at least one portion of the outer surface of the base material; and
an atomic layer deposition film that is formed on the surface of the undercoat layer which is opposite to the surface of the undercoat layer coming into contact with the base material, wherein
at least a portion of precursors of the atomic layer deposition film bind to the undercoat layer,
the atomic layer deposition film is formed into a membrane shape that covers the undercoat layer,
the undercoat layer includes a binder and an inorganic substance,
at least a portion of precursors of the atomic layer deposition film binds to the inorganic substance included in the undercoat layer,
at least a portion of the inorganic substance is exposed on the surface opposite to the surface coming into contact with the base material, and
the precursors of the atomic layer deposition film bind to the outer surface of the exposed inorganic substance.

2. The laminate body according to claim 1,
wherein the binder is one of an organic binder, an in organic binder, and a hybrid binder as a mixture of an organic binder and an inorganic binder, and
a main component of the undercoat layer is the inorganic substance.

3. The laminate body according to claim 1,
wherein the inorganic substance is one of inorganic particles having a particle shape, a layered compound having a layered structure, and a polymer in a form of a sol or gel.

4. The laminate body according to claim 1,
wherein the undercoat layer comprises an organic polymer,
at least a portion of the precursors of the atomic layer deposition film bind to functional groups of the organic polymer comprised in the undercoat layer, and
a main component of the undercoat layer is the organic polymer.

5. The laminate body according to claim 4,
wherein the functional groups of the organic polymer are one of OH groups, COOH groups, COOR groups, COR groups, NCO groups, and $SO_3$ groups, and $NH_x$ (X is an integer) groups.

6. The laminate body according to claim 4,
wherein at least a portion of the surface of the undercoat layer that is opposite to the surface coming into contact with the base material may be treated with surface treatment by plasma treatment or hydrolytic treatment so as to increase the density of the functional groups of the organic polymer.

7. The laminate body according to claim 4, wherein the undercoat layer comprises an inorganic substance, at least in the surface opposite to the surface coming into contact with the base material.

8. A gas barrier film obtained by forming the laminate body according to claim 1 into a film shape.

9. A method of manufacturing a laminate body, comprising:
   loading a base material;
   forming a membrane-like or film-like undercoat layer comprising a binder and an inorganic substance in at least a portion of the outer surface of the base material loaded by the loading;
   removing a portion of the binder exposed on the surface of the undercoat layer which is opposite to the surface of the undercoat layer coming into contact with the base material so as to expose at least a portion of the inorganic substance on the surface of the undercoat layer; and
   forming the atomic layer deposition film on the surface of the undercoat layer which is opposite to the surface of the undercoat layer coming into contact with the base material such that the precursors of the atomic layer deposition film bind to the inorganic substance exposed by the removing the portion of the binder.

10. The method of manufacturing a laminate body according to claim 9,
    wherein in the removing the portion of the binder, a portion of the binder is removed by plasma etching.

11. A method of manufacturing a gas barrier film,
    wherein the laminate body manufactured by the method of manufacturing a laminate body according to according to claim 9 is formed into a film shape.

12. A method of manufacturing a laminate body, comprising:
    loading a base material;
    forming a membrane-like or film-like undercoat layer comprising an organic polymer in at least a portion of the outer surface of the base material loaded by the loading;
    performing surface treatment on a portion of the surface of the undercoat layer which is opposite to the surface of the undercoat layer coming into contact with the base material so as to increase a density of polar functional groups of the organic polymer as compared to a baseline density of the polar functional groups without the surface treatment, the surface treatment being performed on the undercoat layer by oxygen plasma etching where an output power of the oxygen plasma etching is 300 watts and a treatment time of the oxygen plasma etching is 180 seconds; and
    forming the atomic layer deposition film on the surface of the undercoat layer which is opposite to the surface of the undercoat layer coming into contact with the base material such that the precursors of the atomic layer deposition film bind to the polar functional groups of the organic polymer that have increased the density.

13. A method of manufacturing a gas barrier film,
    wherein the laminate body manufactured by the method of manufacturing a laminate body according to according to claim 12 is formed into a film shape.

* * * * *

UNITED STATES PATENT AND TRADEMARK OFFICE
CERTIFICATE OF CORRECTION

| | | |
|---|---|---|
| PATENT NO. | : 9,574,266 B2 | |
| APPLICATION NO. | : 14/164867 | |
| DATED | : February 21, 2017 | |
| INVENTOR(S) | : Mitsuru Kano et al. | |

It is certified that error appears in the above-identified patent and that said Letters Patent is hereby corrected as shown below:

In the Claims

Column 32, Line 41-42 (approx.) (Claim 2, Line 2-3), delete "in organic" and insert --inorganic--, therefor.

Column 34, Line 3-4 (Claim 11, Lines 3-4), delete "according to according to" and insert --according to--, therefor.

Column 34, Line 28 (approx.) (Claim 12, Line 24), after "increased" delete "the".

Column 34, Line 31-32 (approx.) (Claim 13, Lines 3-4), delete "according to according to" and insert --according to--, therefor.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*